(12) United States Patent
Katsuno et al.

(10) Patent No.: US 8,729,583 B2
(45) Date of Patent: May 20, 2014

(54) SEMICONDUCTOR LIGHT-EMITTING DEVICE

(75) Inventors: Hiroshi Katsuno, Tokyo (JP); Yasuo Ohba, Kanagawa-ken (JP); Mitsuhiro Kushibe, Tokyo (JP); Kei Kaneko, Kanagawa-ken (JP); Shinji Yamada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 427 days.

(21) Appl. No.: 12/873,670

(22) Filed: Sep. 1, 2010

(65) Prior Publication Data

US 2011/0220932 A1    Sep. 15, 2011

(30) Foreign Application Priority Data

Mar. 11, 2010  (JP) ................................ 2010-054294

(51) Int. Cl.
*H01L 33/22*    (2010.01)
(52) U.S. Cl.
USPC .. 257/98; 257/76; 257/E33.012; 257/E33.072
(58) Field of Classification Search
None
See application file for complete search history.

(56) References Cited

U.S. PATENT DOCUMENTS

| | | | | |
|---|---|---|---|---|
| 5,717,226 A * | 2/1998 | Lee et al. | ........................ | 257/86 |
| 5,905,275 A * | 5/1999 | Nunoue et al. | .................. | 257/95 |
| 6,459,098 B1 * | 10/2002 | Chen et al. | ....................... | 257/79 |
| 6,580,096 B2 * | 6/2003 | Chen et al. | ....................... | 257/79 |
| 7,176,479 B2 | 2/2007 | Ohba | | |
| 2004/0069999 A1 * | 4/2004 | Lin et al. | ......................... | 257/88 |
| 2004/0144991 A1 * | 7/2004 | Kikkawa | ...................... | 257/103 |
| 2005/0104081 A1 * | 5/2005 | Kim et al. | ....................... | 257/99 |
| 2005/0186694 A1 * | 8/2005 | Takakura et al. | ............... | 438/28 |
| 2005/0285132 A1 * | 12/2005 | Orita | ............................... | 257/99 |
| 2007/0131941 A1 * | 6/2007 | Tanaka et al. | ................... | 257/79 |
| 2008/0006838 A1 * | 1/2008 | Hattori et al. | ................... | 257/98 |
| 2008/0042149 A1 * | 2/2008 | Yoon et al. | ....................... | 257/79 |

(Continued)

FOREIGN PATENT DOCUMENTS

| | | |
|---|---|---|
| JP | 2003-309289 | 10/2003 |
| JP | 2005-5679 | 1/2005 |

(Continued)

OTHER PUBLICATIONS

U.S. Appl. No. 13/204,082, filed Aug. 5, 2011, Katsuno, et al.

(Continued)

*Primary Examiner* — Minh-Loan T Tran
*Assistant Examiner* — Fazli Erdem
(74) *Attorney, Agent, or Firm* — Oblon, Spivak, McClelland, Maier & Neustadt, L.L.P.

(57) ABSTRACT

According to one embodiment, a semiconductor light-emitting device includes a first semiconductor layer, a second semiconductor layer, a light-emitting layer, a third semiconductor layer and a first electrode. The first semiconductor layer of a first conductivity type has a first major surface provided with a first surface asperity. The second semiconductor layer of a second conductivity type is provided on an opposite side of the first semiconductor layer from the first major surface. The light-emitting layer is provided between the first and second semiconductor layers. The first semiconductor layer is disposed between a third semiconductor layer and the light-emitting layer. The third semiconductor layer has an impurity concentration lower than an impurity concentration of the first semiconductor layer, and includes an opening exposing the first surface asperity. The first electrode is in contact with the first surface asperity through the opening, and reflective to emission light emitted from the light-emitting layer.

22 Claims, 12 Drawing Sheets

(56) References Cited

U.S. PATENT DOCUMENTS

| | | | |
|---|---|---|---|
| 2010/0011894 A1 | 1/2010 | Wang et al. | |
| 2010/0072501 A1* | 3/2010 | Wakai et al. | 257/98 |
| 2010/0193826 A1* | 8/2010 | Kim | 257/99 |
| 2010/0213481 A1* | 8/2010 | Hwang | 257/98 |
| 2011/0175073 A1* | 7/2011 | Chang | 257/40 |
| 2011/0204322 A1* | 8/2011 | Weiss et al. | 257/13 |
| 2011/0284864 A1* | 11/2011 | Jeong | 257/76 |

FOREIGN PATENT DOCUMENTS

| | | |
|---|---|---|
| JP | 2007-266577 | 10/2007 |
| JP | 2008-130799 | 6/2008 |
| JP | 2009-123803 | 6/2009 |
| JP | 2010-27643 | 2/2010 |
| WO | WO 2009/068006 A2 | 6/2009 |
| WO | WO 2009/084670 A1 | 7/2009 |

OTHER PUBLICATIONS

U.S. Appl. No. 13/222,302, filed Aug. 31, 2011, Katsuno, et al.
Japanese Office Action issued Apr. 20, 2012, in Patent Application No. 2010-054294 (with English-language translation).
T. Fujii et al., "Increase in the extraction efficiency of GaN-based light-emitting diodes via surface roughening", Applied Physics Letters, vol. 84, No. 6, Feb. 9, 2004, 3 pages.
U.S. Appl. No. 12/873,678, filed Sep. 1, 2010, Hiroshi Katsuno et al.
U.S. Appl. No. 12/719,464, filed Mar. 8, 2010, Hiroshi Katsuno et al.

* cited by examiner

SEMICONDUCTOR LIGHT-EMITTING DEVICE

CROSS-REFERENCE TO RELATED APPLICATIONS

This application is based upon and claims the benefit of priority from the prior Japanese Patent Application No. 2010-054294, filed on Mar. 11, 2010; the entire contents of which are incorporated herein by reference.

FIELD

Embodiments described herein relate generally to a semiconductor light-emitting device.

BACKGROUND

In semiconductor light-emitting devices such as light-emitting diodes (LEDs), it is desirable to increase the light emission efficiency (external quantum efficiency). To this end, it is necessary to improve the internal quantum efficiency and light extraction efficiency.

For instance, T. Fujii, Y. Gao, R. Sharma, E, L. Hu, S. P. DenBaars, and S. Nakamura, Applied Physics Letters vol. 84 No. 6, pp. 855-857 (2004) proposes a configuration for improving the light extraction efficiency. In this configuration, the n-type GaN layer is provided with a surface asperity. However, despite this technique, there is room for improvement in the efficiency of semiconductor light-emitting devices.

DETAILED DESCRIPTION

Figure 1A:
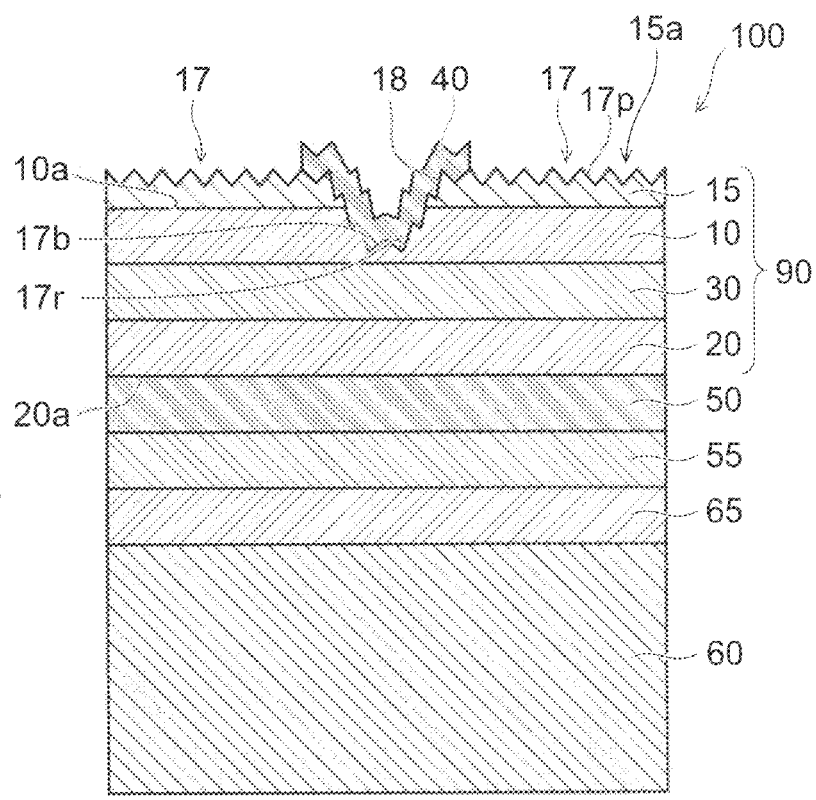
FIGS. 1A and 1B are schematic views showing a semiconductor light-emitting device.

In general, according to one embodiment, a semiconductor light-emitting device includes a first semiconductor layer, a second semiconductor layer, a light-emitting layer, a third semiconductor layer and a first electrode. The first semiconductor layer of a first conductivity type has a first major surface provided with a first surface asperity. The second semiconductor layer of a second conductivity type is provided on an opposite side of the first semiconductor layer from the first major surface. The light-emitting layer is provided between the first semiconductor layer and the second semiconductor layer. The first semiconductor layer is disposed between a third semiconductor layer and the light-emitting layer. The third semiconductor layer has an impurity concentration lower than an impurity concentration of the first semiconductor layer, and includes an opening exposing the first surface asperity. The first electrode is in contact with the first surface asperity through the opening, and reflective to emission light emitted from the light-emitting layer.

Embodiments of the invention will now be described in detail with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, the same components as those described previously with reference to earlier figures are labeled with like reference numerals, and the detailed description thereof is omitted as appropriate.

First Embodiment

Figure 1B:
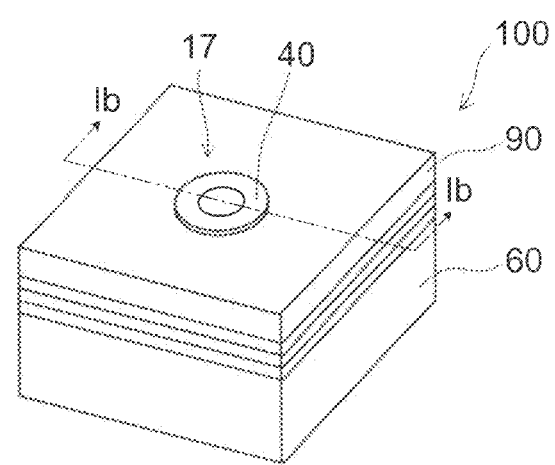

FIGS. 1A and 1B are schematic views illustrating the configuration of a semiconductor light-emitting device according to a first embodiment.

More specifically, FIG. 1B is a schematic perspective view illustrating the configuration of the semiconductor light-emitting device 100. FIG. 1A is a sectional view taken along line Ib-Ib shown in FIG. 1B.

As shown in FIG. 1A, the semiconductor light-emitting device 100 includes a first semiconductor layer 10 of a first conductivity type, a second semiconductor layer 20 of a second conductivity type, a light-emitting layer 30, a third semiconductor layer 15, and a first electrode 40.

The first semiconductor layer 10 has a first major surface 10a provided with a surface asperity (first semiconductor layer surface asperity 17r). That is, the first semiconductor layer surface asperity 17r is provided on at least part of the first major surface 10a. On the first major surface 10a, the portion provided with the first semiconductor layer surface asperity 17r is referred to as first semiconductor layer rough surface portion 17b.

The second semiconductor layer 20 is provided on the opposite side of the first semiconductor layer 10 from the first major surface 10a.

The light-emitting layer 30 is provided between the first semiconductor layer 10 and the second semiconductor layer 20.

For instance, the peak wavelength of emission light emitted from the light-emitting layer 30 in the first semiconductor layer 10 can be set shorter than the size of the first semiconductor layer surface asperity 17r. That is, in this case, the size of the first semiconductor layer surface asperity 17r is larger than the peak wavelength in the first semiconductor layer 10 of emission light emitted from the light-emitting layer 30. However, the embodiment of the invention is not limited thereto. As described later, the size of the first semiconductor layer surface asperity 17r may be comparable to the peak wavelength in the first semiconductor layer 10 of emission light emitted from the light-emitting layer 30.

The first semiconductor layer 10 is disposed between the third semiconductor layer and the light-emitting layer, and the third semiconductor layer 15 is provided on the first major surface 10a of the first semiconductor layer 10. The third semiconductor layer 15 has a lower impurity concentration than the first semiconductor layer 10. The third semiconductor layer 15 includes an opening 18 exposing the surface asperity (first semiconductor layer surface asperity 17r).

The first electrode 40 is in contact with the first semiconductor layer rough surface portion 17b provided with the first semiconductor layer surface asperity 17r of the first major surface 10a of the first semiconductor layer 10. That is, the first electrode 40 is in contact with the surface asperity (first semiconductor layer surface asperity 17r) of the first major surface 10a of the first semiconductor layer 10 through the opening 18.

The first electrode 40 is reflective to emission light emitted from the light-emitting layer 30. For instance, specifically, the first electrode 40 can include Al or an Al alloy. However, the embodiment of the invention is not limited thereto. The first electrode 40 can be made of any conductive material reflecting emission light emitted from the light-emitting layer 30. Materials desirable for the first electrode 40 are described later.

For instance, the first semiconductor layer 10, the second semiconductor layer 20, the light-emitting layer 30, and the third semiconductor layer 15 include nitride semiconductors. The first conductivity type is e.g. n-type, and the second conductivity type is e.g. p-type. In this case, the first semiconductor layer 10 is an n-type semiconductor layer, and the second semiconductor layer 20 is a p-type semiconductor layer. However, this embodiment is not limited thereto. The first conductivity type may be p-type, and the second conductivity type may be n-type. In the following description, it is assumed that the first conductivity type is n-type, and the second conductivity type is p-type.

In this example, the third semiconductor layer 15 includes a surface asperity 17p. The surface asperity 17p is provided on the third major surface 15a. The surface asperity 17p is larger than the peak wavelength in the third semiconductor layer of emission light emitted from the light-emitting layer 30.

In the semiconductor light-emitting device 100, a stacked structure 90 is provided above a conductive substrate 60.

More specifically, the stacked structure 90 includes the first semiconductor layer 10, the second semiconductor layer 20, the light-emitting layer 30, and the third semiconductor layer 15. The second semiconductor layer 20 is provided on the conductive substrate 60 side of the third semiconductor layer 15. The light-emitting layer 30 is provided between the second semiconductor layer 20 and the third semiconductor layer 15. The first semiconductor layer 10 is provided between the light-emitting layer 30 and the third semiconductor layer 15.

The third semiconductor layer 15 has a lower impurity concentration than the first semiconductor layer 10. For instance, the third semiconductor layer 15 a non-doped semiconductor layer. For instance, the impurity concentration in the third semiconductor layer 15 is lower than the detection limit. More particularly, the impurity concentration in the third semiconductor layer 15 can be the background concentration observed in the case where the third semiconductor layer 15 is not intentionally doped with n-type and p-type impurity. The third semiconductor layer 15 may contain impurity at a lower concentration than the first semiconductor layer 10.

As shown in FIG. 1A, the first semiconductor layer surface asperity 17r is provided in the first semiconductor layer rough surface portion 17b of the first semiconductor layer 10 at the bottom of the opening 18. The first electrode 40 is in contact with the first semiconductor layer rough surface portion 17b through the opening 18, and is provided on the major surface 15a of the third semiconductor layer 15. The wall surface of the opening 18 is also provided with a surface asperity. In the wall surface of the opening 18, the surface exposing the first semiconductor layer 10 is provided with a surface asperity having the same size as the first semiconductor layer surface asperity 17r, and the surface exposing the third semiconductor layer 15 is provided with a surface asperity having the same size as the surface asperity 17p.

As shown in FIG. 1A, a second electrode 50 electrically connected to the second semiconductor layer 20 is provided on the second major surface 20a of the second semiconductor layer 20 on the opposite side from the light-emitting layer 30. In this example, an adhesion metal layer 55 is provided between the second electrode 50 and the conductive substrate 60. Furthermore, a bonding metal layer 65 is provided between the adhesion metal layer 55 and the conductive substrate 60. The bonding metal layer 65 is made of e.g. AuSn solder. In this example, the first electrode 40 is an n-side electrode, and the second electrode 50 is a p-side electrode.

The second electrode 50 can be a reflective electrode for causing emission light emitted from the light-emitting layer 30 to be reflected from the second electrode 50 toward the first semiconductor layer 10. Specifically, the second electrode 50 can include Ag.

Figure 2A:
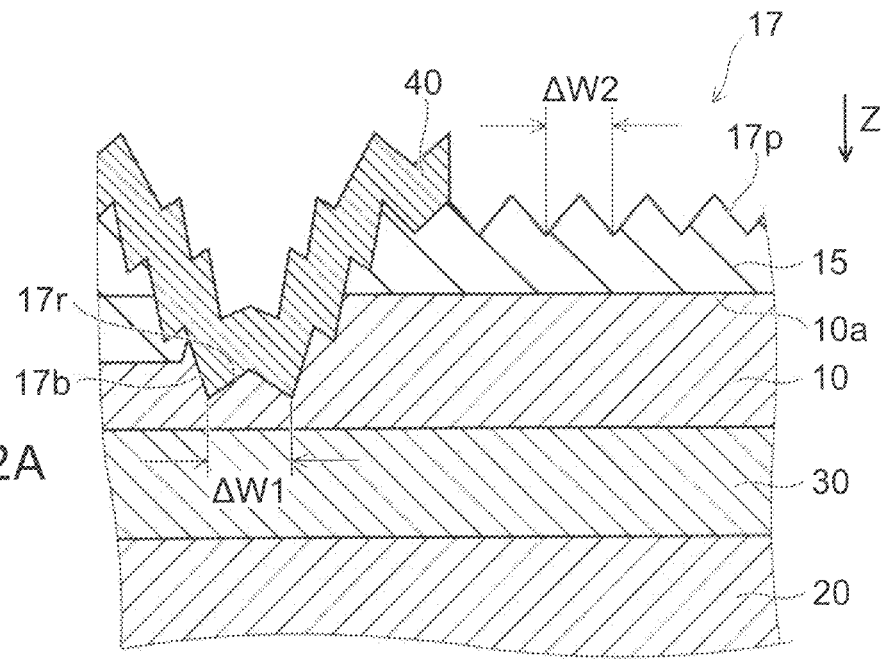
FIG. 2A is a schematic cross-sectional view showing part of the semiconductor light-emitting device.
Figure 2B:
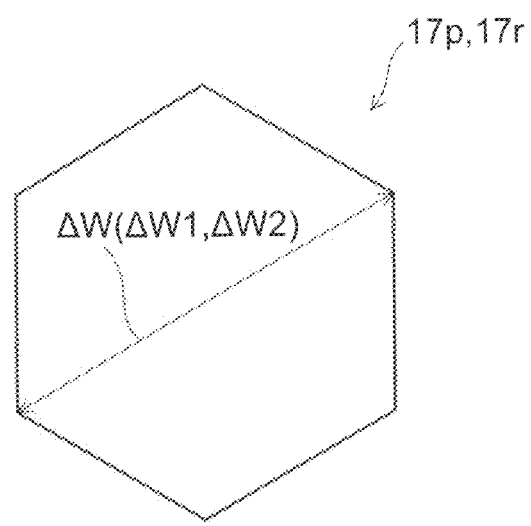
FIG. 2B illustrates an example of a planar shape of the surface asperity shown in FIG. 2A.

FIG. 2A is a schematic cross-sectional view illustrating the configuration of part of the semiconductor light-emitting device according to the first embodiment. FIG. 2B illustrates an example of a planar shape of the surface asperity shown in FIG. 2A.

As shown in FIG. 2A, the first semiconductor layer surface asperity 17r provided in the first semiconductor layer rough surface portion 17b and the surface asperity 17p provided in the rough surface portion 17 include a plurality of protrusions. For instance, the protrusion is formed by processing the surface of the first semiconductor layer 10 and the third semiconductor layer 15, respectively.

In the protrusion provided in the first semiconductor layer rough surface portion 17b, the maximum width $\Delta W1$ along the direction perpendicular to the stacking direction (Z-axis direction) from the first semiconductor layer 10 to the second semiconductor layer 20 is set comparable to, for instance, the peak wavelength in the first semiconductor layer 10 of emission light emitted from the light-emitting layer 30.

On the other hand, in the protrusion provided in the rough surface portion 17, the maximum width $\Delta W2$ along the direction perpendicular to the stacking direction from the first semiconductor layer 10 to the second semiconductor layer 20 is set larger than the peak wavelength in the third semiconductor layer 15 of emission light emitted from the light-emitting layer 30.

As shown in FIG. 2B, for instance, in the first semiconductor layer 10 and the third semiconductor layer 15 made of nitride semiconductors, the planar shape of the protrusion as viewed in the Z-axis direction can be a generally hexagonal shape. In this case, the maximum width $\Delta W$ (maximum width $\Delta W1$ maximum width $\Delta W2$) is the width between diagonal vertices of the hexagon.

Here, the peak wavelength refers to the wavelength of light with maximum intensity in the emission light emitted from the light-emitting layer 30. The peak wavelength is a wavelength corresponding to the peak value of the spectral distribution of emission light. For a spectrum having two or more local maxima except noise levels, the wavelength for any one of the peak values may be selected.

An example method for fabricating the semiconductor light-emitting device 100 is briefly described.

For instance, on a substrate, not shown, a third semiconductor layer 15, a first semiconductor layer 10, a light-emitting layer 30, and a second semiconductor layer 20 are crystal grown in the order of the third semiconductor layer 15, the first semiconductor layer 10, the light-emitting layer 30, and the second semiconductor layer 20 to form a stacked structure 90. Subsequently, a second electrode 50 is formed on the second major surface 20a, or the upper surface, of the second semiconductor layer 20. An adhesion metal layer 55 is formed on the second electrode 50.

Next, for instance, a bonding metal layer 65 provided on a conductive substrate 60 is opposed and laminated to the adhesion metal layer 55 on the second semiconductor layer 20 side. Thus, the stacked structure 90 is bonded to the conductive substrate 60. Furthermore, for instance, by using a process such as laser lift-off described later, the substrate, not shown, is separated from the stacked structure 90.

Next, an opening is formed in the third major surface 15a of the third semiconductor layer 15 of the stacked structure 90 to expose the first semiconductor layer rough surface portion 17b of the first semiconductor layer 10. Subsequently, a first semiconductor layer surface asperity 17r and a surface asperity 17p are formed on the first semiconductor layer rough surface portion 17b and the third major surface 15a, respectively. For instance, the first semiconductor layer rough surface portion 17b and the third major surface 15a are processed by e.g. etching to form a first semiconductor layer surface asperity 17r and a surface asperity 17p as prescribed. Subsequently, a first electrode 40 is formed in the opening 18. As an alternative method for forming the surface asperity 17p of the rough surface portion 17, for instance, the surface asperity left after the separation of the substrate, not shown, can be used as a surface asperity 17p.

Figure 3:
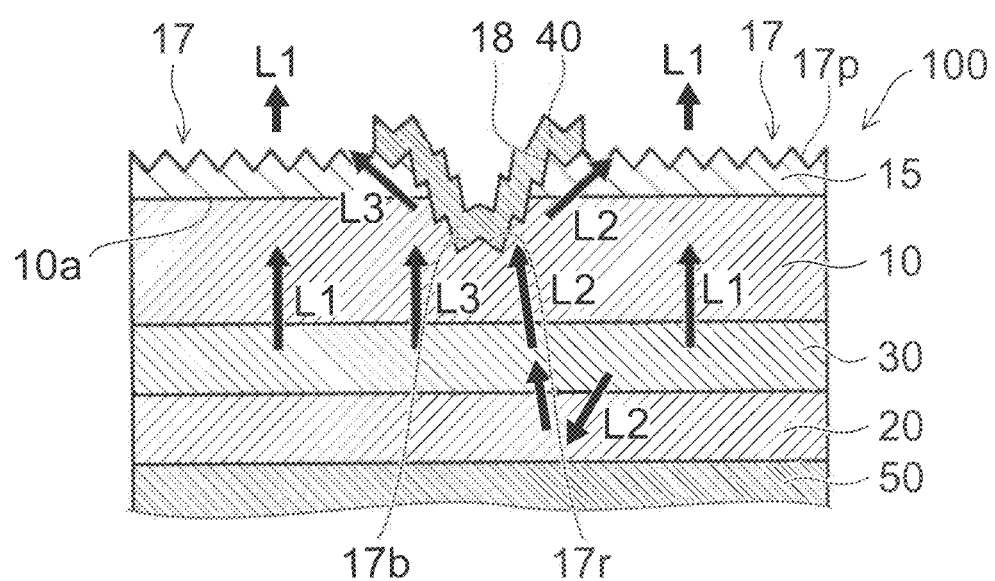
FIG. 3 is a schematic view showing the characteristics of the semiconductor light-emitting device.

FIG. 3 is a schematic view illustrating the characteristics of the semiconductor light-emitting device 100.

Light L1, which is part of emission light emitted from the light-emitting layer 30, is directly emitted outside through the first semiconductor layer 10.

On the other hand, light L3 propagated toward the first electrode 40 is reflected by the first electrode 40. Here, the direction of the light L3 is varied by the first semiconductor layer surface asperity 17r provided in the first semiconductor layer rough surface portion 17b. Thus, at least part of the light L3 is emitted outside.

Light L2 propagated toward the second electrode 50 is reflected at the interface between the second semiconductor layer 20 and the second electrode 50 and propagated toward the first semiconductor layer 10. Here, at least part of the light L2 is reflected by the first semiconductor layer surface asperity 17r provided in the first semiconductor layer rough surface portion 17b. Thus, this light varies its propagation direction and is emitted outside.

That is, the first semiconductor layer surface asperity 17r provided in the first semiconductor layer rough surface portion 17b of the first semiconductor layer 10 can increase the chances of varying the incident angle of emission light. Thus, the light extraction efficiency is increased.

Thus, in the semiconductor light-emitting device 100 according to this embodiment, a semiconductor light-emitting device with high efficiency is achieved.

Furthermore, in this specific example, the third semiconductor layer 15 is provided with a rough surface portion 17 having a surface asperity 17p. The rough surface portion 17 varies the traveling direction of light. Thus, the light extraction efficiency is further increased.

Next, an example method for manufacturing the semiconductor light-emitting device 100 according to this embodiment is described.

Figure 4A:
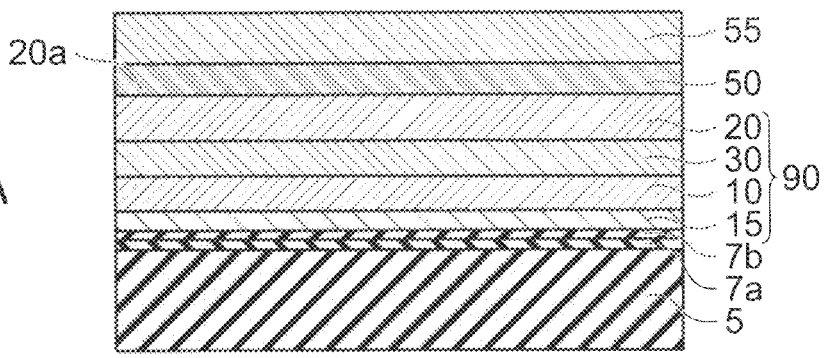
FIGS. 4A and 4B are sequential schematic cross-sectional views showing a method for manufacturing a semiconductor light-emitting device.
Figure 4B:
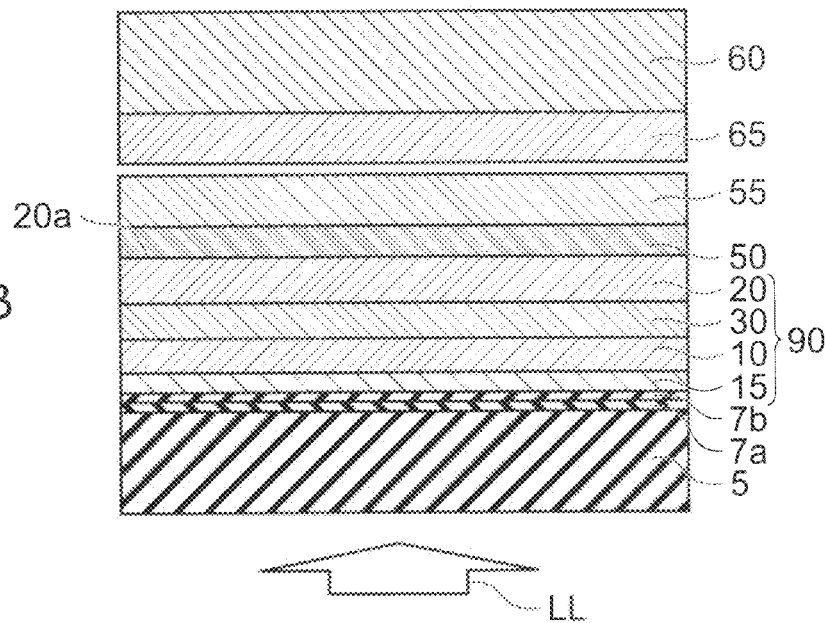

FIGS. 4A and 4B are sequential schematic cross-sectional views illustrating a method for manufacturing a semiconductor light-emitting device according to the first embodiment.

As shown in FIG. 4A, the semiconductor light-emitting device 100 is composed of nitride semiconductors formed on a sapphire substrate 5. More specifically, the semiconductor light-emitting device 100 can have a structure in which, for instance, by metal organic chemical vapor deposition, the following layers are sequentially stacked on a substrate whose surface is a sapphire c-surface: a high carbon concentration first AlN buffer layer 7a (carbon concentration $3 \times 10^{18}$-$5 \times 10^{20}$ cm$^{-3}$) with a thickness of 3-20 nm, a high-purity second AlN buffer layer 7b (carbon concentration $1 \times 10^{16}$-$3 \times 10^{18}$ cm$^{-3}$) with a thickness of 2 μm, a non-doped GaN buffer layer with a thickness of 2 μm, a Si-doped n-type GaN contact layer (Si concentration $1 \times 10^{18}$-$1 \times 10^{20}$ cm$^{-3}$) with a thickness of 2 μm, a Si-doped n-type $Al_{0.10}Ga_{0.90}N$ cladding layer (Si concentration $1 \times 10^{18}$ cm$^{-3}$) with a thickness of 0.02 μm, a light-emitting layer 30 having a multiple quantum well structure with Si-doped n-type $Al_{0.11}Ga_{0.89}N$ barrier layers (Si concentration $1.1$-$1.5 \times 10^{19}$ cm$^{-3}$) and GaInN light-emitting layers (wavelength 375-395 nm) alternately stacked three periods with a thickness of 0.075 μm, an $Al_{0.11}Ga_{0.89}N$ barrier layer (Si concentration $1.1$-$1.5 \times 10^{19}$ cm$^{-3}$) with a thickness of 0.01 μm serving as the last barrier layer of the multiple quantum well, a Si-doped n-type $Al_{0.11}Ga_{0.89}N$ layer (Si concentration $0.8$-$1.0 \times 10^{19}$ cm$^{-3}$) with a thickness of 0.01 μm, a non-doped $Al_{0.11}Ga_{0.89}N$ spacer layer with a thickness of 0.02 μm, a Mg-doped p-type $Al_{0.28}Ga_{0.72}N$ cladding layer (Mg concentration $1 \times 10^{19}$ cm$^{-3}$) with a thickness of 0.02 μm, a Mg-doped p-type GaN contact layer (Mg concentration $1 \times 10^{19}$ cm$^{-3}$) with a thickness of 0.1 μm, and a highly Mg-doped p-type GaN contact layer (Mg concentration $5$-$9 \times 10^{19}$ cm$^{-3}$) with a thickness of 0.02 μm.

The above non-doped GaN buffer layer serves as the third semiconductor layer 15. At least one of the Si-doped n-type GaN contact layer and the Si-doped n-type $Al_{0.10}Ga_{0.90}N$ cladding layer is included in the first semiconductor layer 10. At least one of the Mg-doped $Al_{0.28}Ga_{0.72}N$ cladding layer, the Mg-doped p-type GaN contact layer, and the highly Mg-doped p-type GaN contact layer is included in the second semiconductor layer 20.

If the Mg concentration of the highly Mg-doped p-type GaN contact layer is as relatively high as $1 \times 10^{20}$ cm$^{-3}$ or more and less than $1 \times 10^{21}$ cm$^{-3}$, the ohmic contact with the p-side electrode can be improved. However, in the case of semiconductor light-emitting diodes, in contrast to semiconductor laser diodes, the distance between the contact layer and the light-emitting layer is short. Hence, there is concern about characteristics degradation due to Mg diffusion. Here, the contact area between the p-side electrode and the highly Mg-doped p-type GaN contact layer is large, which results in low current density during operation. Exploiting this fact, the Mg concentration in the highly Mg-doped p-type GaN contact layer can be reduced to $1 \times 10^{19}$ cm$^{-3}$ or more and less than $1 \times 10^{20}$ cm$^{-3}$ without significantly impairing the electrical characteristics. Thus, Mg diffusion can be prevented, and the light emission characteristics can be improved.

The high carbon concentration first AlN buffer layer 7a serves to relax the difference in crystal type from the substrate, and particularly reduces screw dislocations. Furthermore, the high-purity second AlN buffer layer 7b serves to planarize the surface at the atomic level. This reduces crystal defects in the non-doped GaN buffer layer grown thereon. To this end, the film thickness of the high-purity second AlN buffer layer 7b is preferably thicker than 1 μm. Furthermore, to prevent warpage due to strain, the thickness of the high-purity second AlN buffer layer 7b is preferably 4 μm or less. The high-purity second AlN buffer layer 7b is not limited to AlN, but may be made of $Al_xGa_{1-x}N$ (0.8≤x≤1). Thus, the wafer warpage can be compensated.

The non-doped GaN buffer layer is formed by three-dimensional island growth on the high-purity second AlN buffer layer 7b, and thereby serves to reduce crystal defects. To planarize the growth surface, the average film thickness of the non-doped GaN buffer layer is preferably 2 μm or more. From the viewpoint of reproducibility and warpage reduction, the total film thickness of the non-doped GaN buffer layer is suitably 2-10 μm.

By using these buffer layers, crystal defects can be reduced to approximately 1/10 as compared with conventional AlN buffer layers formed by low-temperature growth. The present technique makes it possible to produce a highly efficient semiconductor light-emitting device despite high Si doping of the n-type GaN contact layer and light emission in the ultraviolet band. Furthermore, by reducing crystal defects in the non-doped GaN buffer layer, absorption of light in the non-doped GaN buffer layer can also be suppressed.

Next, electrode formation on the stacked structure and bonding of the stacked structure to the conductive substrate are described.

First, to form a p-side electrode, a vacuum evaporation apparatus is used for continuous formation of, for instance, Ag to a film thickness of 200 nm and Pt to a film thickness of 2 nm. After lift-off, sintering treatment is performed in an oxygen atmosphere at 400° C. for 1 min. Then, as an adhesion metal layer 55, for instance, Ni/Au is formed to a film thickness of 1000 nm on the p-side electrode.

Next, an AuSn solder with a film thickness of 3 μm formed on the conductive substrate made of Ge is opposed to the adhesion metal layer 55 formed on the stacked structure. By heating to a temperature equal to or higher than the eutectic point of AuSn, such as 300° C., the conductive substrate is bonded to the sapphire substrate.

Then, from the sapphire substrate side, for instance, the third harmonic (355 nm) or fourth harmonic (266 nm) laser light of an $YVO_4$ solid-state laser is applied. The laser light has a wavelength shorter than the forbidden band wavelength corresponding to the forbidden bandwidth of GaN in the GaN buffer layer (e.g., the aforementioned non-doped GaN buffer layer). That is, the laser light has energy higher than the forbidden bandwidth of GaN.

This laser light is efficiently absorbed in the region on the single crystal AlN buffer layer (in this example, the second AlN buffer layer) side of the GaN buffer layer (non-doped GaN buffer layer). Thus, GaN in the GaN buffer layer on the single crystal AlN buffer layer side is decomposed by generated heat. The decomposed GaN is removed by e.g. hydrochloric acid treatment. Thus, the sapphire substrate is removed and separated from the stacked structure.

Next, formation of an electrode, and a surface asperity 17p and a first semiconductor layer surface asperity 17r on the exposed stacked structure is described.

After removing the sapphire substrate from the conductive substrate, part of the non-doped GaN buffer layer (third semiconductor layer 15) on the conductive substrate is removed to expose the n-type contact layer (e.g., the aforementioned Si-doped n-type GaN contact layer, i.e., first semiconductor layer 10). Here, to prevent step disconnection of the n-side electrode, processing into a tapered shape is preferable. For instance, a recess tapered at 50° can be formed by dry etching with chlorine gas using a resist mask.

Subsequently, the surface of the non-doped GaN buffer layer and the tapered recess is processed by alkaline etching with KOH solution to form a surface asperity. Thus, a first semiconductor layer surface asperity 17r is formed on the surface of the non-doped GaN buffer layer, and a surface asperity 17p is formed on the n-type GaN contact layer. Here, the etching with KOH solution is performed under the following condition, for instance: 1 mol/L of the solution is heated to 80° C., and etching is performed for 20 min.

Furthermore, by e.g. lift-off, an Al/Pt/Au stacked film, for instance, is formed to a thickness of e.g. 500 nm so as to cover entirely the exposed n-type contact layer and partly the non-doped GaN buffer layer. The stacked film is patterned into an n-side electrode.

Next, by cleavage or diamond blade cutting, the conductive substrate is cut into individual devices. Thus, the semiconductor light-emitting device is fabricated.

The semiconductor light-emitting device 100 according to this embodiment includes at least semiconductor layers including an n-type semiconductor layer, a p-type semiconductor layer, and a light-emitting layer sandwiched therebetween. The material of the semiconductor layers is not particularly limited. For instance, gallium nitride-based compound semiconductors such as $Al_xGa_{1-x-y}In_yN$ (x≥0, y≥0, x+y≤1) are used. The method for forming these semiconductor layers is not particularly limited. For instance, known methods such as metal organic chemical vapor deposition and molecular beam epitaxy can be used.

The conductive substrate can be made of any conductive material, and is not particularly limited. For instance, a semiconductor substrate of Si or Ge, and a metal plate of Cu or CuW can be used. Furthermore, the substrate does not need to be entirely conductive. A resin plate including metal wirings may also be used.

The p-side electrode includes at least silver or an alloy thereof. For instance, a single layer film of metal other than silver has substantial reflection efficiency in the visible band. However, the reflection efficiency of a single layer film of metal other than silver tends to decrease with the decrease of wavelength in the ultraviolet region of 400 nm or less. In contrast, silver has high reflection efficiency characteristics also for light in the ultraviolet band of 370 nm or more and 400 nm or less. Hence, in the case of semiconductor light-emitting devices for ultraviolet emission with the p-side electrode made of a silver alloy, it is preferable that the portion of the p-side electrode on the semiconductor interface side have a higher component ratio of silver. The film thickness of the p-side electrode is preferably 100 nm or more to ensure the light reflection efficiency.

To prevent solder from diffusing into or reacting with the p-side electrode, a diffusion prevention layer in electrical contact with the p-side electrode may be provided on the p-side electrode. The diffusion prevention layer has the property of not reacting with silver, or not actively diffusing into silver.

The diffusion prevention layer can be made of a single layer film or a stacked film of high melting point metal such as vanadium (V), chromium (Cr), iron (Fe), cobalt (Co), nickel (Ni), niobium (Nb), molybdenum (Mo), ruthenium (Ru), rhodium (Rh), tantalum (Ta), tungsten (W), rhenium (Re), iridium (Ir), and platinum (Pt).

More preferably, the metal constituting the diffusion prevention layer has high work function so that some diffusion causes no problem, and the metal is likely to form ohmic contact with the p-type GaN contact layer. Such metals include iron (Fe), cobalt (Co), nickel (Ni), rhodium (Rh), tungsten (W), rhenium (Re), iridium (Ir), and platinum (Pt).

In the case of a single layer film, the film thickness of the diffusion prevention layer is preferably in the range from 5 to 200 nm so that the film state can be maintained. In the case of a stacked film, the film thickness is not particularly limited, but can be selected in the range from 10 to 10000 nm, for instance.

When the stacked structure on the sapphire substrate is bonded to the conductive substrate of e.g. Ge, and when GaN is decomposed by laser light to remove the sapphire substrate, crystals are susceptible to crystal defects and damage. The crystal defects and damage are caused by the thermal expansion coefficient difference between the conductive substrate and sapphire or GaN, heat due to local heating, and products generated by decomposition of GaN. If crystal defects and damage occur, Ag of the p-side electrode diffuses through the crystal defects and damage. This results in accelerated increase of leaks and crystal defects inside the crystal.

In this embodiment, a high quality semiconductor layer can be formed by using a single crystal AlN buffer layer. Hence, damage to crystals is significantly reduced. Furthermore, when GaN is decomposed by laser light, heat is dissipated into the AlN buffer layer located in the close vicinity of GaN and having high thermal conductivity characteristics. Hence, thermal damage due to local heating is less likely to occur.

As the size of the n-side electrode formed on the n-type contact layer increases, its contact resistance to the n-type contact layer decreases. Hence, the operating voltage is reduced. Conversely, as the size of the n-side electrode decreases, a smaller proportion of emitted light is absorbed or prevented from going outside by the n-side electrode. Hence, the light extraction efficiency increases. On the other hand, part of the n-side electrode is used also as an electrode for wire bonding. Hence, the n-side electrode requires a considerable amount of area, such as a diameter of 80 to 120 µm. With these factors taken into consideration, the area and shape of the exposed n-type contact layer and the area and shape of the n-side electrode can be freely determined.

With the thinning of the film thickness of the n-type contact layer, the lateral spread of current is limited. This results in nonuniform light emission and increased operating voltage due to nonuniform current injection. With the thickening of the film thickness of the n-type contact layer, the cost increases due to prolonged growth. However, in general, the Si-doped n-type GaN contact layer has low sheet resistance. Hence, the influence of thinning on the nonuniform current injection is limited.

Furthermore, there is an optimum value for the film thickness of the n-type contact layer in improving the crystal quality. The optimum value depends on the growth condition of the buffer layer and the impurity concentration of the n-type contact layer. Furthermore, by thinning the n-type contact layer, the substrate warpage can be reduced, allowing yield improvement. With these taken into consideration, the film thickness of the n-type contact layer can be freely determined.

The method for forming the first semiconductor layer surface asperity 17r of the first semiconductor layer rough surface portion 17b and the surface asperity 17p of the rough surface portion 17 may be either wet etching or dry etching. As the etching amount (the depth from the surface before etching to the deepest position of the surface asperity formed by etching) increases, the first semiconductor layer surface asperity 17r and the surface asperity 17p are formed more densely and in a larger size. Alkaline etching with e.g. KOH solution provides anisotropic etching along the surface orientation of the GaN crystal, mainly along {10-1-1}. This results in a generally hexagonal pyramid structure. The etching rate and the size and density of hexagonal pyramids are greatly varied with the etching temperature and time, pH (adjusted by addition of other substances), concentration, and presence or absence of UV light or UV laser irradiation.

Alternatively, the first semiconductor layer surface asperity 17r and the surface asperity 17p may be formed by dry etching using a mask. In this case, despite cost increase due to the increased number of process steps, the first semiconductor layer surface asperity 17r and the surface asperity 17p can be formed as designed. Hence, the light extraction efficiency is easily increased.

To effectively extract emission light to the outside by varying its incident angle, the size of the surface asperity 17p is preferably equal to or larger than the emission wavelength in the stacked structure. If the surface asperity 17p is smaller than the emission wavelength, the emission light incident on the surface asperity 17p exhibits wave-optical behavior such as scattering and diffraction at the surface asperity interface. Hence, part of the emission light otherwise transmitted therethrough is not extracted. Furthermore, if the surface asperity 17p is sufficiently smaller than the emission wavelength, the surface asperity 17p is regarded as a layer with a continuously varying refractive index. Hence, the surface asperity 17p is similar to a flat surface without surface asperity, and does not improve the light extraction efficiency.

A semiconductor light-emitting device with an emission wavelength of 390 nm (the emission wavelength in the stacked structure being approximately 155 nm) was fabricated based on this embodiment. According to experimental results using this semiconductor light-emitting device, as the size of the surface asperity 17p increases, the optical output power tends to increase. Until the size of the surface asperity 17p reaches approximately 2 µm, the optical output power tends to gradually increase. Hence, the size of the surface asperity 17p is preferably twice or more, and more preferably 10 times or more, of the emission wavelength in the stacked structure.

In this embodiment, in the case of surface asperity processing with KOH solution using the n-side electrode as a mask, it is necessary to protect the layer susceptible to etching with KOH solution, such as a Ti layer. For instance, after forming up to Ti/Pt by e-gun evaporation, Au is formed by resistance heating evaporation to protect the first layer, i.e., Ti. The Au layer formed by resistance heating evaporation is evaporated more isotropically than other metal layers formed by e-gun evaporation. Hence, the Au layer can be extended to the inside of the overhang structure of the lift-off resist. Thus, Ti/Pt can be entirely covered with Au. Alternatively, a metal film resistant to KOH solution can be used as a mask. If this metal film has good ohmic contact with the n-type contact layer, the metal film may be used as is. If there is any problem with ohmic contact, the metal film can be removed after surface asperity processing, and an n-side electrode can be formed separately.

The material of the n-side electrode is not particularly limited. For instance, with the first layer made of Al, the n-side electrode has good ohmic characteristics and low contact resistance with the n-type contact layer, and also serves as a reflective electrode. Thus, the light extraction efficiency and the design flexibility of the n-side electrode are improved. In view of poor environment resistance of Al, an Al alloy containing a slight amount of Si, for instance, can be used to improve the reliability and adhesiveness.

In the region for wire bonding on the n-side electrode, to improve bonding characteristics, Au can be formed thickly, e.g., to a thickness of 10 μm, by plating on the surface of the n-side electrode.

COMPARATIVE EXAMPLE

Figure 5:
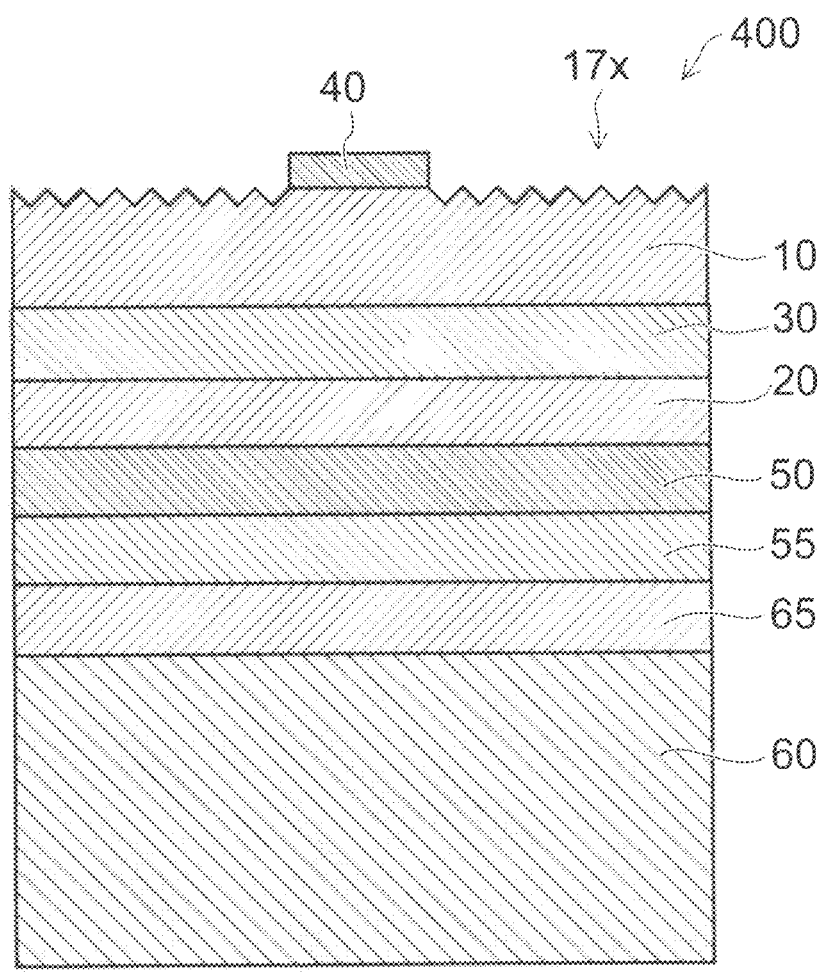
FIG. 5 is a schematic cross-sectional view illustrating a semiconductor light-emitting device according to a comparative example.

FIG. 5 is a schematic cross-sectional view illustrating the configuration of a semiconductor light-emitting device of a comparative example.

As shown in FIG. 5, in the semiconductor light-emitting device 400 of the comparative example, the portion of the first semiconductor layer 10 in contact with the first electrode 40 is not provided with the surface asperity. On the other hand, the portion of the first semiconductor layer 10 outside the first electrode 40 is provided with a rough surface portion 17x having a surface asperity.

The semiconductor light-emitting device 400 of the comparative example is fabricated as follows. After removing the sapphire substrate from the conductive substrate, the non-doped GaN buffer layer (third semiconductor layer 15) on the conductive substrate is removed by dry etching to expose the n-type contact layer (first semiconductor layer 10). By e.g. lift-off, a Ti/Pt/Au stacked film, for instance, is formed to a thickness of e.g. 500 nm so as to cover part of the exposed n-type contact layer. The stacked film is patterned into an n-side electrode (first electrode 40). Subsequently, the surface of the n-type contact layer outside the n-side electrode is processed by alkaline etching with KOH solution to form a surface asperity, thereby forming a rough surface portion 17x.

In the semiconductor light-emitting device 400, the portion of the first semiconductor layer 10 in contact with the first electrode 40 is not provided with the surface asperity. Hence, the effect of varying the direction of emission light emitted immediately below the first electrode 40 and directing the light to the outside is lower. Thus, in the semiconductor light-emitting device 400 of the comparative example, the light extraction efficiency is lower.

In contrast, in the semiconductor light-emitting device 100 according to this embodiment, the first semiconductor layer surface asperity 17r provided in the first semiconductor layer rough surface portion 17b of the first semiconductor layer 10 can increase the chances of varying the incident angle of emission light. Thus, the light extraction efficiency is increased.

Furthermore, in the semiconductor light-emitting device 100, the third semiconductor layer 15 is provided with a rough surface portion 17 having a surface asperity 17p. Thus, the light extraction efficiency is further increased.

Typically, because silver is used for the reflective electrode (p-side electrode) and solder is used as the bonding material, it is difficult to perform high temperature sintering on the n-side electrode. Thus, to achieve good ohmic characteristics, an n-type contact layer highly doped with impurity is needed. Due to the effect of impurity, a highly doped GaN layer has higher internal absorption than a non-doped GaN buffer layer.

In the semiconductor light-emitting device 400 according to the above comparative example, the highly doped n-type contact layer is provided with a rough surface portion 17x having a surface asperity. Hence, the internal absorption is higher. Furthermore, a highly doped n-type contact layer is prone to surface roughness and impurity segregation caused by processing for forming the surface asperity. This leads to the decrease of light extraction efficiency. Furthermore, the first layer of the n-side electrode is made of Ti, which has low reflectance. Hence, part of emission light repeating reflection inside the crystal layer is absorbed by the n-side electrode. This causes the decrease of light extraction efficiency.

In contrast, in the semiconductor light-emitting device 100 according to this embodiment, the rough surface portion 17 having a surface asperity 17p is provided on the third semiconductor layer 15 (e.g., non-doped GaN buffer layer). Hence, the internal absorption can be further reduced. In addition, surface roughness and impurity segregation in the rough surface portion 17 can also be suppressed. Thus, the light extraction efficiency can be further increased.

Furthermore, in the semiconductor light-emitting device 100, the n-side electrode is formed on the first semiconductor layer surface asperity 17r. This increases the effective contact area between the n-side electrode and the n-type contact layer, and achieves good electrical characteristics. Al is a metal having a problem with adhesiveness. However, the first electrode 40 including Al is formed on the first semiconductor layer surface asperity 17r. This can also improve the adhesiveness.

Furthermore, in the semiconductor light-emitting device 100, the n-side electrode is formed in a recess from which part of the n-type contact layer has been removed. Thus, the effective surface area of the n-side electrode increases. This enhances the effect achieved by forming the n-side electrode as a reflective electrode. Furthermore, because of the configuration in which the recess having a reflective structure is formed in the crystal layer, it is easy to vary the reflection angle of emission light propagated in the crystal layer without being extracted outside. This facilitates increasing the light extraction efficiency.

Furthermore, the n-side electrode has a recessed shape. Hence, the n-side electrode can function as a guide for wire bonding. Thus, the positioning accuracy can be improved, allowing cost reduction by reducing the task time.

FIGS. 6A to 6E are schematic views showing alternative semiconductor light-emitting devices according to the first embodiment.

In the semiconductor light-emitting devices illustrated in these figures, the configuration of the third semiconductor layer 15 and the first electrode 40 is different from that in the semiconductor light-emitting device 100.

Figure 6A:
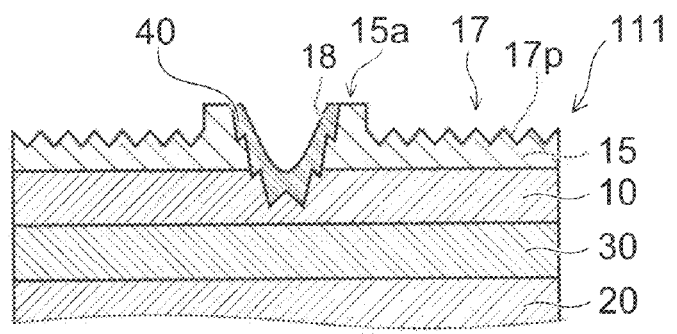
FIGS. 6A to 6E are schematic cross-sectional views showing part of semiconductor light-emitting devices.

As shown in FIG. 6A, in the semiconductor light-emitting device 111, the first electrode 40 covers the surface of the first semiconductor layer 10 at the bottom of the opening 18 and the inner wall of the opening 18. The upper surface of the first electrode 40 is substantially flush with the upper surface of the third semiconductor layer 15.

Figure 6B:
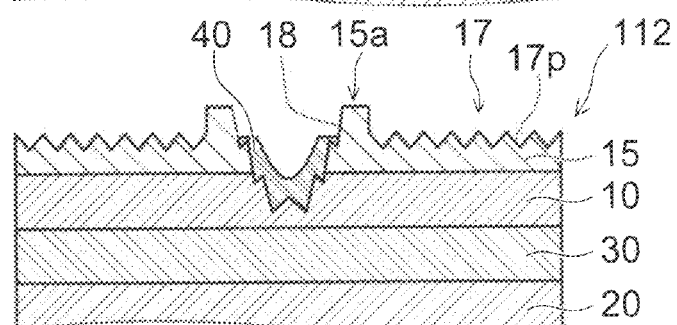

As shown in FIG. 6B, in the semiconductor light-emitting device 112, the first electrode 40 is buried inside the opening 18. The upper surface of the first electrode 40 is located between the upper surface of the first semiconductor layer 10 and the upper surface of the third semiconductor layer 15.

Figure 6C:
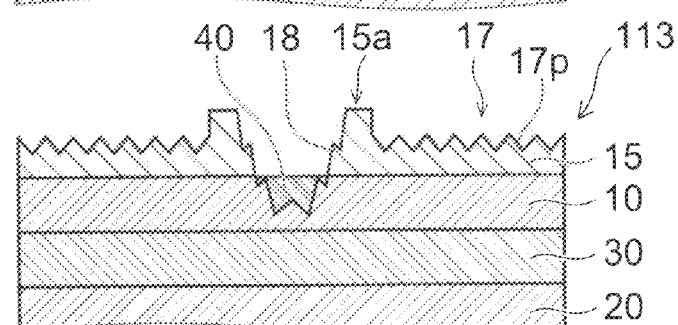

As shown in FIG. 6C, in the semiconductor light-emitting device 113, the first electrode 40 is buried in the first semiconductor layer 10 inside the opening 18. That is, the height of the upper surface of the first electrode 40 is substantially matched with the height of the upper surface of the first semiconductor layer 10.

Figure 6D:
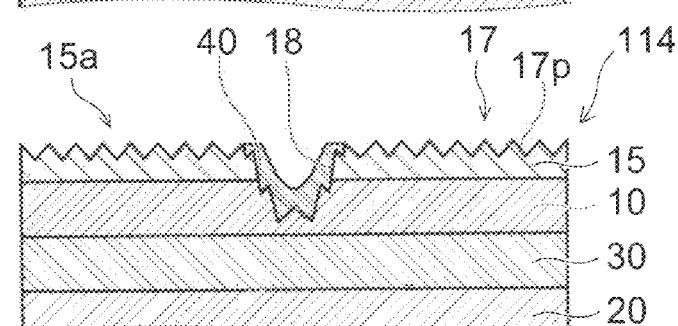
Figure 6E:
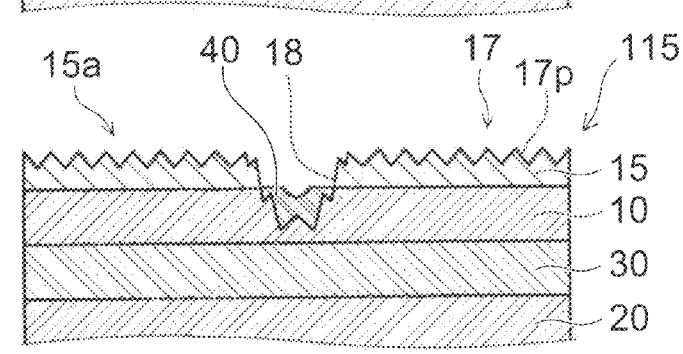

As shown in FIGS. 6D and 6E, in the semiconductor light-emitting device 114 and the semiconductor light-emitting device 115, the surface asperity 17p is provided entirely on the major surface 15a of the third semiconductor layer 15, and the first electrode 40 is provided inside the opening 18. In the semiconductor light-emitting device 114, the upper surface of the first electrode 40 is substantially flush with the third major surface 15a of the third semiconductor layer 15. In the semiconductor light-emitting device 115, the upper surface of the first electrode 40 is located below the third major surface 15a of the third semiconductor layer 15.

Figure 7:
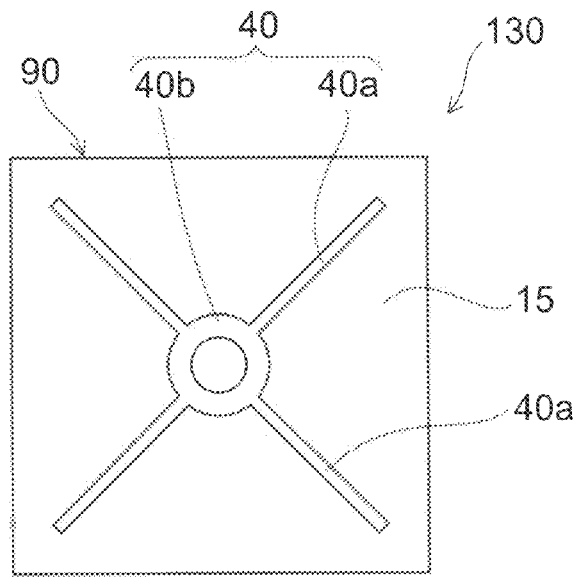
FIG. 7 is a plan view schematically showing a semiconductor light-emitting device.

FIG. 7 is a plan view schematically showing an alternative semiconductor light-emitting device 130 according to the first embodiment.

More specifically, this figure is a schematic plan view of the semiconductor light-emitting device 130 as viewed along the stacking direction from the third semiconductor layer 15 side.

As shown in FIG. 7, a pad electrode 40b, which is part of the first electrode 40, is provided at the center of the third major surface 15a of the third semiconductor layer 15. An auxiliary electrode 40a extends from the pad electrode 40b toward the periphery of the third major surface 15a. The auxiliary electrode 40a is electrically connected to the pad electrode 40b. The pad electrode 40b and the auxiliary electrode 40a are included in the first electrode 40. The auxiliary electrode 40a serves so that the current injected from the second electrode 50, not shown, into the light-emitting layer 30 is spread throughout the device surface.

Thus, the first electrode 40 may include a pad electrode 40b and an auxiliary electrode 40a. The first electrode 40 can have an arbitrary shape. Thus, it is only necessary that a surface asperity (first semiconductor layer surface asperity 17r) be provided in at least part of the first electrode 40 having an arbitrary shape in contact with the first semiconductor layer 10.

For instance, the third semiconductor layer 15 can be etched away in the region where the pad electrode 40b and the auxiliary electrode 40a are to be provided. On the first semiconductor layer 10 exposed in that region, the pad electrode 40b and the auxiliary electrode 40a can be formed. The first semiconductor layer rough surface portion 17b including the first semiconductor layer surface asperity 17r can be provided in at least part of the region where the pad electrode 40b and the auxiliary electrode 40a are provided.

Thus, the emission light emitted from the light-emitting layer 30 below the pad electrode 40b and the auxiliary electrode 40a can be efficiently extracted. That is, without decreasing the light extraction efficiency, the auxiliary electrode 40a is provided so that the current injected into the light-emitting layer 30 can be made uniform. Thus, the light extraction efficiency can be further increased.

Figure 8A:
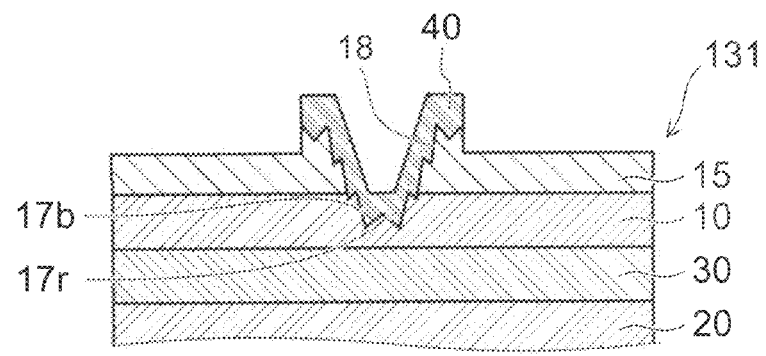
FIGS. 8A and 8B are schematic cross-sectional views showing semiconductor light-emitting devices.
Figure 8B:
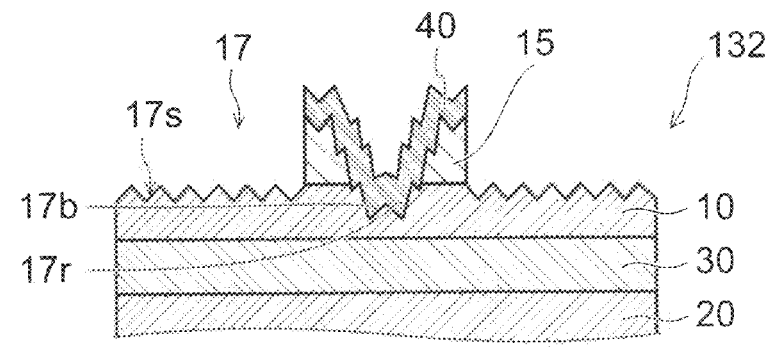

FIGS. 8A and 8B are schematic views showing alternative semiconductor light-emitting devices according to the first embodiment.

In the semiconductor light-emitting devices illustrated in these figures, the configuration of the third semiconductor layer 15 and the first electrode 40 is different from that in the semiconductor light-emitting device 100.

As shown in FIG. 8A, in the semiconductor light-emitting device 131, the third semiconductor layer 15 is not provided with the surface asperity. Also in the semiconductor light-emitting device 131 thus configured, the first semiconductor layer rough surface portion 17b including the first semiconductor layer surface asperity 17r is provided on the portion of the first semiconductor layer 10 with the first electrode 40 provided thereon. Thus, the light extraction efficiency is increased.

As shown in FIG. 8B, in the semiconductor light-emitting device 132, the third semiconductor layer 15 exists in the portion covered with the first electrode 40. However, the third semiconductor layer 15 is not provided in the other portion. The region of the first semiconductor layer 10 outside the first electrode 40 is provided with a surface asperity 17s. Also in the semiconductor light-emitting device 132, the first semiconductor layer rough surface portion 17b including the first semiconductor layer surface asperity 17r is provided on the portion of the first semiconductor layer 10 with the first electrode 40 provided thereon. Thus, the light extraction efficiency is increased. In addition, the surface asperity 17s is further provided on the first semiconductor layer 10. Thus, the light extraction efficiency is further increased.

Second Embodiment

Figure 9A:
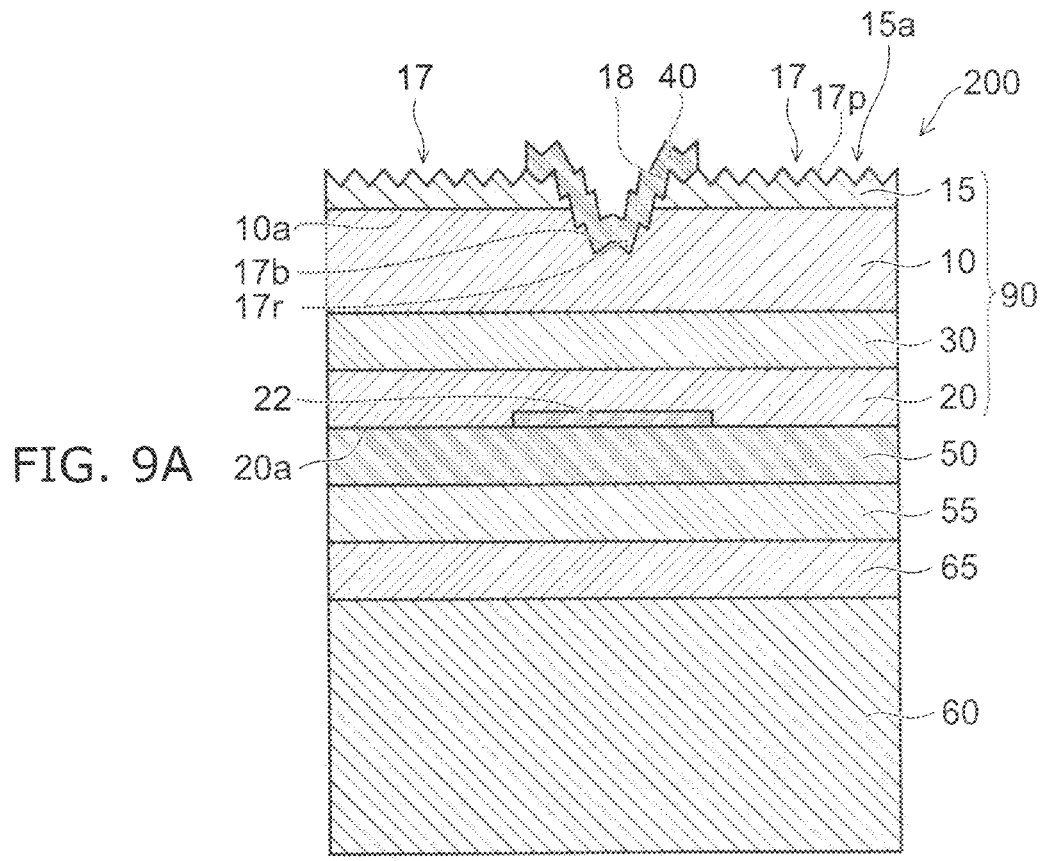
FIGS. 9A and 9B are schematic cross-sectional views showing a semiconductor light-emitting device.
Figure 9B:
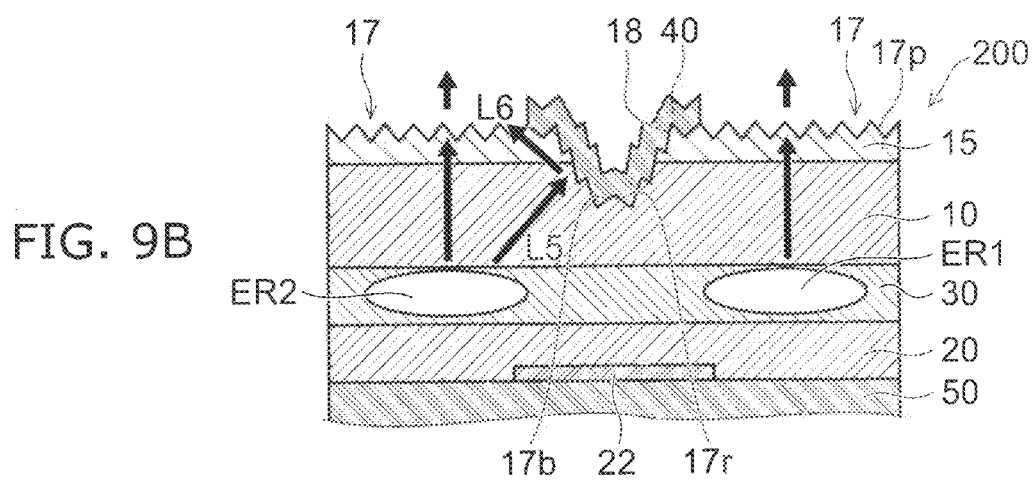

FIGS. 9A and 9B are schematic cross-sectional views illustrating the configuration of a semiconductor light-emitting device according to a second embodiment.

FIG. 9A is a schematic sectional view illustrating the structure of the semiconductor light-emitting device 200. FIG. 9B is a schematic view showing the characteristics of the semiconductor light-emitting device 200.

As shown in FIG. 9A, also in the semiconductor light-emitting device 200 according to this embodiment, the first semiconductor layer rough surface portion 17b includes a first semiconductor layer surface asperity 17r. Furthermore, also in this case, the third semiconductor layer 15 is provided with a rough surface portion 17 including a surface asperity 17p. However, the rough surface portion 17 may be provided as needed. In the following description, it is assumed that the rough surface portion 17 is provided.

The second semiconductor layer 20 includes a low electrical characteristics portion 22. As viewed along the stacking direction from the first semiconductor layer 10 to the second semiconductor layer 20, the low electrical characteristics portion 22 is provided in a region including the region where the second semiconductor layer 20 overlaps the first electrode 40. The low electrical characteristics portion 22 has at least one of higher contact resistance and lower ohmic characteristics between the second semiconductor layer and the second electrode than the region where the second semiconductor layer 20 does not overlap the first electrode 40.

As illustrated in FIG. 9B, a current is passed from the second electrode 50 toward the first electrode 40 of the semiconductor light-emitting device 200. The low electrical characteristics portion 22 has low electrical characteristics (at least one of high contact resistance and low ohmic characteristics). Hence, the current is injected into the light-emitting layer 30 from the portion (in this example, the portion opposed to the rough surface portion 17) other than the portion opposed to the first electrode 40. Thus, emission light is mainly emitted from the light-emitting regions ER1 and ER2 corresponding to the portion other than the portion opposed to the first electrode 40. On the other hand, light emission is relatively suppressed in the region between the first electrode 40 and the low electrical characteristics portion 22.

That is, in the semiconductor light-emitting device 200, by providing the low electrical characteristics portion 22, the path of current injected into the light-emitting layer 30 can be shifted to the light-emitting regions ER1, ER2 opposed to the rough surface portion 17. Thus, the light-emitting regions ER1, ER2 mainly emit light. Hence, emission light can be efficiently extracted from the rough surface portion 17 to the outside of the stacked structure 90.

Furthermore, as described above, by the first semiconductor layer surface asperity 17r and the reflective first electrode 40, light L5 directed to the first electrode 40 can be reflected and efficiently extracted outside as light L6.

An example method for manufacturing the semiconductor light-emitting device 200 is described.

First, a stacked structure 90 is formed. Then, before forming a p-side electrode, a resist mask is formed to expose the p-type GaN layer in the region of the stacked structure 90 immediately below the area for forming the n-side electrode (the region may include its surroundings as necessary, e.g., the region may reach approximately 20 µm away from immediately below the n-side electrode). In this state, the second semiconductor layer 20 is subjected to e.g. $O_2$ ashing treatment. Subsequently, as in the first embodiment, the process from the formation of the p-side electrode to the removal of the sapphire substrate is performed.

After removing the sapphire substrate, part of the non-doped GaN buffer layer is removed to expose the n-type contact layer. For instance, this is performed by dry etching with chlorine gas using a resist mask. Next, the surface of the exposed n-type contact layer and the surface of the non-doped GaN buffer layer are processed by alkaline etching with KOH solution to form a surface asperity. Then, by e.g. lift-off, an Al/Ni/Au stacked film, for instance, is formed to a thickness of e.g. 700 nm so as to cover entirely the exposed n-type contact layer and partly the non-doped GaN buffer layer. The stacked film is patterned into an n-side electrode.

The surface of the p-type GaN layer treated by $O_2$ ashing is significantly degraded in ohmic characteristics and contact resistance. Hence, little current flows therein. Thus, no light emission occurs in the light-emitting layer immediately below the n-side electrode and therearound. In the structure as in the first embodiment, with the increase of current, the current starts to concentrate on the light-emitting layer immediately below the n-side electrode. This results in the increase of operating voltage due to nonuniform injection, the decrease of light extraction efficiency due to absorption of emission light in the n-side electrode, and the decrease of light emission efficiency due to increased current density. According to this embodiment, the current concentration can be prevented. Besides $O_2$ ashing treatment, it is also possible to use dry etching or wet etching to thinly strip the surface of the p-type GaN layer. Simple exposure to a plasma atmosphere may also be used.

Furthermore, the n-side electrode is formed as a reflective electrode. Hence, emission light is not absorbed by the n-side electrode, and the light extraction efficiency is increased. In this embodiment, the current is prevented from flowing immediately below the n-side electrode. This is particularly effective for the structure in which light emission occurs also immediately below the n-side electrode and therearound. Thus, the design flexibility of the n-side electrode is increased.

By forming the n-side electrode as a reflective electrode and performing surface asperity processing also immediately below the n-side electrode, the chances of varying the incident angle of emission light with respect to the light-extracting portion can be increased. Thus, the light extraction efficiency is increased. For instance, as in this embodiment, in the case where no light emission occurs immediately below the n-side electrode and therearound, the light incident on the surface asperity immediately below the n-side electrode is primarily composed of the reflected emission light without being extracted outside. Hence, in this case, this embodiment is more effective.

Although Al is a metal having a problem with adhesiveness, formation of a surface asperity can improve the adhesiveness. Furthermore, in the case of forming the n-side electrode in a recess from which part of the n-type contact layer has been removed, the effective surface area of the n-side electrode increases. This enhances the effect achieved by forming the n-side electrode as a reflective electrode. Furthermore, because of the configuration in which the recess having a reflective structure is formed in the stacked structure, it is easy to vary the reflection angle of emission light propagated in the stacked structure without being extracted outside. This facilitates increasing the light extraction efficiency.

Figure 10A:
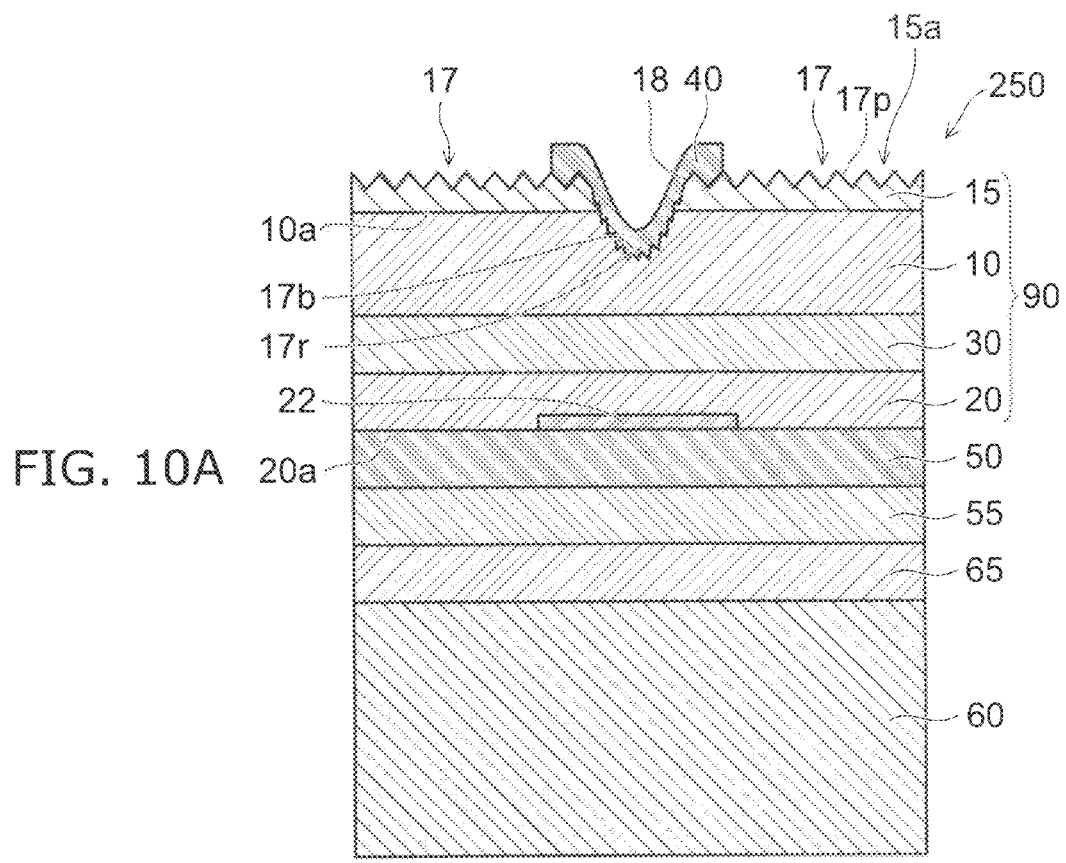
FIGS. 10A and 10B are schematic cross-sectional views showing a semiconductor light-emitting device.
Figure 10B:
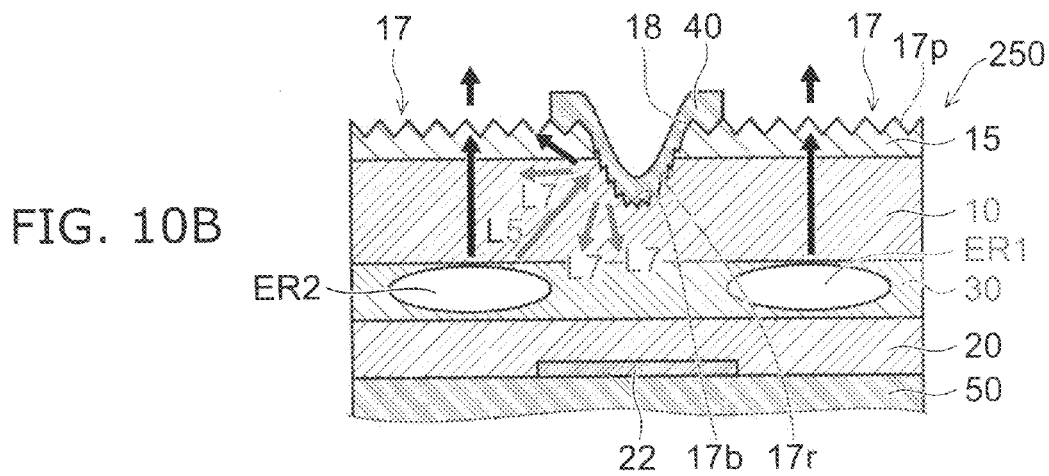

FIGS. 10A and 10B are schematic views illustrating the configuration and characteristics of an alternative semiconductor light-emitting device according to the second embodiment.

More specifically, FIG. 10A is a schematic sectional view illustrating the configuration of the semiconductor light-emitting device 250. FIG. 10B is a schematic view illustrating the characteristics of the semiconductor light-emitting device 250.

As shown in FIG. 10A, in the alternative semiconductor light-emitting device 250 according to this embodiment, the first semiconductor layer surface asperity 17r of the first semiconductor layer rough surface portion 17b provided in the first semiconductor layer 10 corresponding to the opening 18 has a smaller size than the surface asperity 17p of the rough surface portion 17. The size of the first semiconductor layer surface asperity 17r is, for instance, comparable to the peak wavelength of emission light.

As shown in FIG. 10B, light L5 is emitted from the light-emitting regions ER1 and ER2 of the light-emitting layer 30 opposed to the rough surface portion 17. Then, the light L5 propagated toward the first electrode 40 is reflected at the interface between the first electrode 40 and the first semiconductor layer 10. Because the size of the first semiconductor layer surface asperity 17r is comparable to the wavelength, the light L5 is diffused by the effect of scattering and diffraction, and reflected in a relatively isotropic manner. Thus, the light L7 reflected at the interface between the first electrode 40 and the first semiconductor layer 10 is isotropically propagated in the stacked structure 90. Hence, the light extraction efficiency can be increased.

Next, an example method for manufacturing the semiconductor light-emitting device 250 is described regarding differences from that for the semiconductor light-emitting device 200.

After removing part of the non-doped GaN buffer layer to expose the n-type contact layer, the major surface is entirely dry etched under the condition favoring anisotropic etching depending on the crystal orientation. For instance, it is possible to use etching with chlorine based on ICP-RIE, with the milling-like etching mode suppressed. In this case, the non-doped GaN buffer layer and the highly doped n-type contact layer have different etching rates, such as 2:1. Using this etching rate difference, a surface asperity 17p equal to or larger than the emission wavelength is formed on the non-doped GaN buffer layer, and simultaneously, a first semiconductor layer surface asperity 17r comparable to the emission wavelength is formed on the n-type contact layer.

In the case of processing GaN by dry etching, the N surface, in contrast to the Ga surface, is susceptible to crystal orientation and dislocations, and easily subjected to anisotropic etching. The surface of GaN grown on the c-surface sapphire substrate is normally a Ga surface. On the other hand, the surface of GaN exposed by removing the sapphire substrate is an N surface. Thus, a surface asperity 17p with a size equal to or larger than the emission wavelength, and a first semiconductor layer surface asperity 17r with a size comparable to the emission wavelength are easily formed by anisotropic etching based on dry etching.

In the region of the n-type contact layer immediately below the n-side electrode, diffuse reflection occurs due to scattering and diffraction, exhibiting relatively isotropic reflection characteristics. This can increase the chances that the emission light incident on the surface asperity immediately below the n-side electrode (first semiconductor layer surface asper-

Third Embodiment

Figure 11:
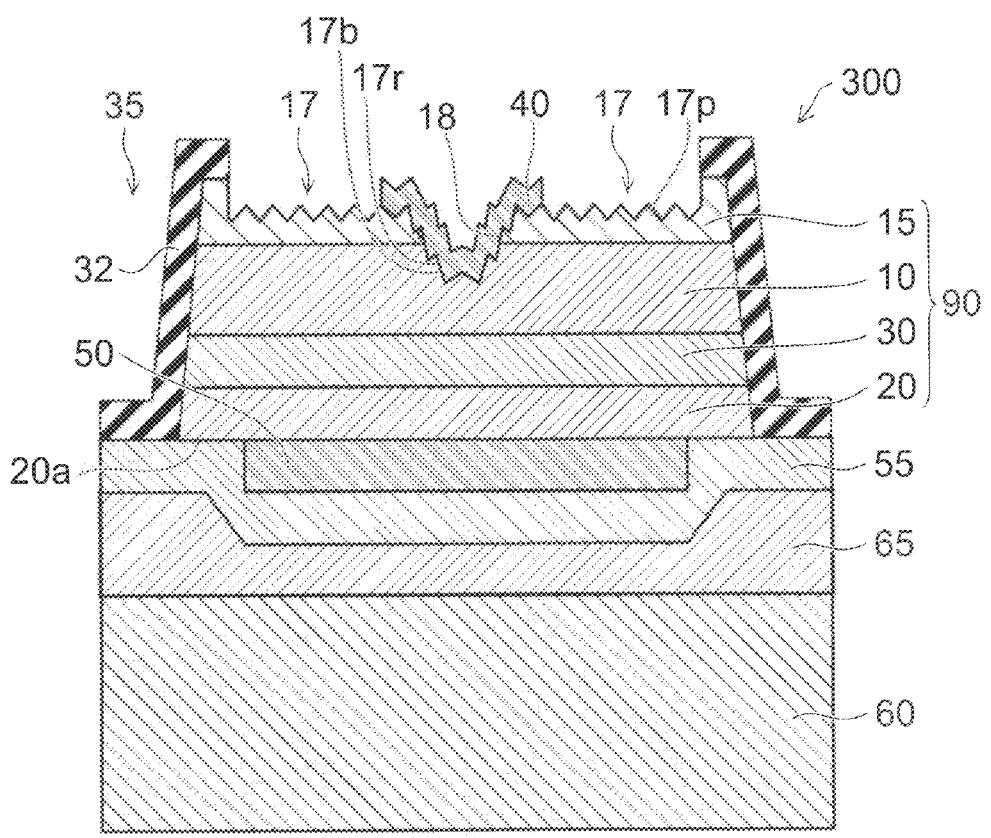
FIG. 11 is a schematic cross-sectional view showing a semiconductor light-emitting device.

FIG. 11 is a schematic sectional view illustrating the configuration of a semiconductor light-emitting device according to a third embodiment.

As shown in FIG. 11, the semiconductor light-emitting device 300 further includes a dielectric film 32 provided on the side surface of the stacked structure 90. In the semiconductor light-emitting device 300, for instance, after patterning the second electrode 50 and removing the sapphire substrate, a device isolation trench 35 is formed in the stacked structure 90. A dielectric film 32 is formed on the side surface of the stacked structure 90.

The semiconductor light-emitting device 300 according to this embodiment includes the surface asperity 17p and the first semiconductor layer surface asperity 17r described above. The size of the surface asperity 17p (the width of the protrusion) provided on the third semiconductor layer 15 is larger than the wavelength in the third semiconductor layer 15 of the peak wavelength of emission light emitted from the light-emitting layer 30. Furthermore, in this case, the size of the first semiconductor layer surface asperity 17r (the width of the protrusion) provided on the first semiconductor layer 10 is larger than the wavelength in the first semiconductor layer 10 of the peak wavelength of emission light emitted from the light-emitting layer 30.

An example method for manufacturing the semiconductor light-emitting device 300 is described.

First, after forming the stacked structure 90, a p-side electrode is formed. Here, the p-side electrode is patterned by lift-off so as to be narrower than the pitch of device isolation trenches formed later. After lift-off, sintering treatment is performed in an oxygen atmosphere at 400° C. for 1 min. Then, as an adhesion metal layer 55, for instance, Ni/Au is formed to a film thickness of 1000 nm entirely on the major surface of the p-type GaN layer side, including on the p-side electrode.

Subsequently, an AuSn solder with a film thickness of 3 μm formed on the conductive substrate made of Ge is opposed to the adhesion metal layer 55 formed on the stacked structure. By heating to a temperature equal to or higher than the eutectic point of AuSn, such as 300° C., the conductive substrate is bonded to the sapphire substrate.

Then, from the sapphire substrate side, for instance, the fourth harmonic (266 nm) laser light of an $YVO_4$ solid-state laser is applied. Thus, GaN in the GaN buffer layer on the single crystal AlN buffer layer side is decomposed by generated heat. The decomposed GaN is removed by e.g. hydrochloric acid treatment. Thus, the sapphire substrate is removed and separated from the stacked structure.

After removing the sapphire substrate, part of the non-doped GaN buffer layer is removed to expose the n-type contact layer. For instance, this is performed by dry etching with chlorine gas using a resist mask.

Subsequently, to separate the stacked structure into individual devices, part of the stacked structure is completely removed by dry etching using a resist mask to form a device isolation trench. Here, to prevent step disconnection of $SiO_2$ formed later, the device isolation trench is preferably shaped like a taper. Subsequently, by a sputtering apparatus, for instance, $SiO_2$ constituting a dielectric film 32 is formed to a film thickness of 400 nm entirely on the major surface on the stacked structure side.

Next, a lift-off resist is formed so as to expose $SiO_2$ in a region covering entirely the exposed n-type contact layer and partly the non-doped GaN buffer layer. Ammonium fluoride treatment is performed to remove $SiO_2$ in that region. The surface of the exposed n-type contact layer and the non-doped GaN buffer layer is processed by alkaline etching with KOH solution to form a surface asperity 17p and a first semiconductor layer surface asperity 17r. By lift-off, a Ti/Pt/Au stacked film, for instance, is formed to a thickness of e.g. 500 nm entirely on the first semiconductor layer surface asperity 17r and partly on the surface asperity 17p. The stacked film is patterned into an n-side electrode.

Thus, the semiconductor light-emitting device 300 illustrated in FIG. 11 is fabricated.

Ag used for the p-side electrode is altered or degraded by dry etching and alkaline etching. This leads to degradation in the reflection characteristics for emission light and the electrical characteristics of the p-type GaN layer. However, as in this embodiment, by enclosing the p-side electrode with the p-type GaN layer and the adhesion metal layer 55, the degradation of the p-side electrode can be suppressed. Consequently, the adhesion metal layer 55 rises in the region where the p-side electrode is formed. However, when the adhesion metal layer 55 is bonded with the solder on the conductive substrate, the solder is deformed so that the adhesion metal layer 55 including the region outside the p-side electrode can be bonded.

Thus, by forming $SiO_2$, the lateral side of the light-emitting layer can be passivated, and the electrical characteristics can be improved.

Figure 12:
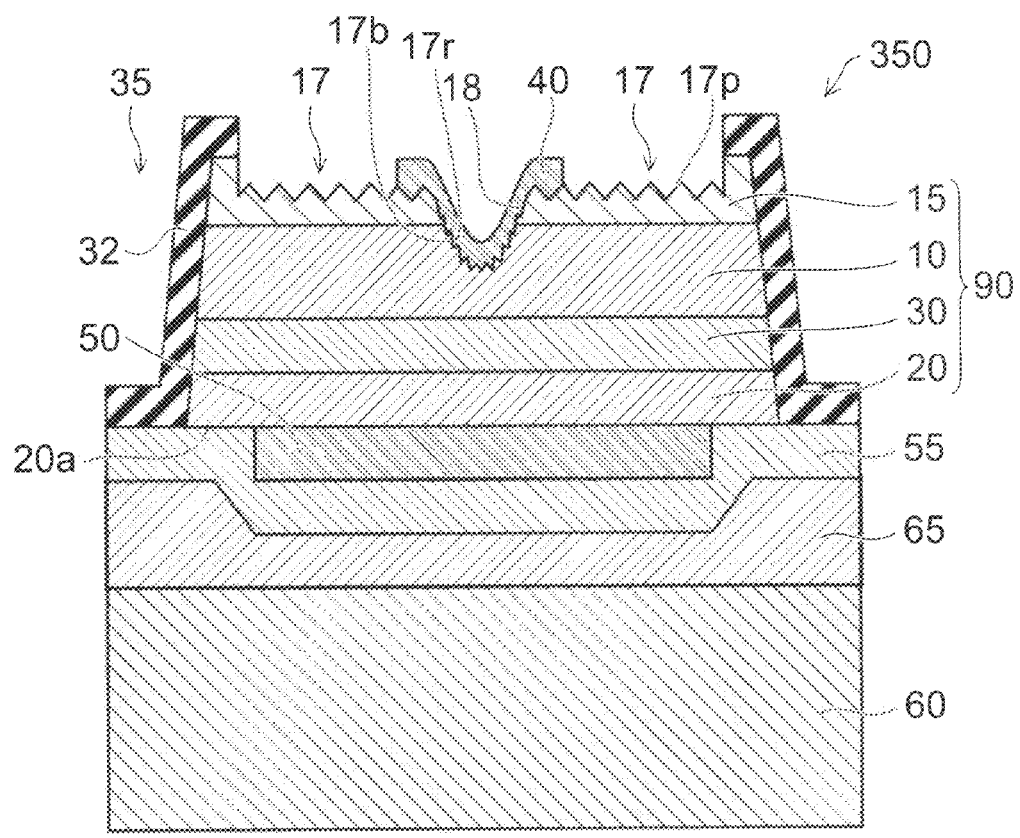
FIG. 12 is a schematic cross-sectional view showing a semiconductor light-emitting device.

FIG. 12 is a schematic cross-sectional view illustrating the configuration of an alternative semiconductor light-emitting device according to the third embodiment.

As shown in FIG. 12, the semiconductor light-emitting device 350 also includes the surface asperity 17p and the first semiconductor layer surface asperity 17r described above. In this case, the first semiconductor layer surface asperity 17r has a smaller size than the surface asperity 17p of the rough surface portion 17. The size of the first semiconductor layer surface asperity 17r is, for instance, comparable to the peak wavelength of emission light.

Also in the semiconductor light-emitting device 350, the size of the first semiconductor layer surface asperity 17r is as small as the wavelength. Hence, light is diffused by the effect of scattering and diffraction, and reflected in a relatively isotropic manner. Thus, the light reflected at the interface between the first electrode 40 and the first semiconductor layer 10 can be efficiently extracted.

The method for manufacturing a semiconductor apparatus according to an embodiment of the invention is a method for manufacturing the aforementioned semiconductor apparatus.

More specifically, this manufacturing method is a method for manufacturing a semiconductor light-emitting device having a stacked structure 90. The stacked structure 90 includes a first semiconductor layer 10 of a first conductivity type, a second semiconductor layer 20 of a second conductivity type, a light-emitting layer 30 provided between the first semiconductor layer 10 and the second semiconductor layer 20, and a third semiconductor layer 15 provided on the opposite side of the first semiconductor layer 10 from the light-emitting layer 30 and having a lower impurity concentration than the first semiconductor layer 10.

In this manufacturing method, first, on a sapphire substrate 5 via a buffer layer including AlN, the third semiconductor layer 15, the first semiconductor layer 10, the light-emitting layer 30, and the second semiconductor layer 20 are formed in the order of the third semiconductor layer 15, the first semiconductor layer 10, the light-emitting layer 30, and the second semiconductor layer 20 to form the stacked structure 90.

Then, after bonding the stacked structure 90 to a conductive substrate, for instance, the sapphire substrate is separated from the stacked structure 90 between the buffer layer and the third semiconductor layer 15.

Furthermore, in the third semiconductor layer 15 exposed by separating the sapphire substrate 5, an opening 18 communicating with the first semiconductor layer 10 is provided. A first semiconductor layer surface asperity 17r is formed on the first semiconductor layer 10 exposed at the bottom surface of the opening 18. At this time, a surface asperity 17p may be formed on the third semiconductor layer 15.

The aforementioned formation of the first semiconductor layer surface asperity 17r and the surface asperity 17p can include the step of wet etching the first semiconductor layer 10 with KOH solution.

The aforementioned surface of the third semiconductor layer 15 exposed by separating the sapphire substrate 5 is an N surface of a GaN crystal. The aforementioned formation of the surface asperity 17p can include the step of performing anisotropic dry etching on the first semiconductor layer 10.

Figure 13:
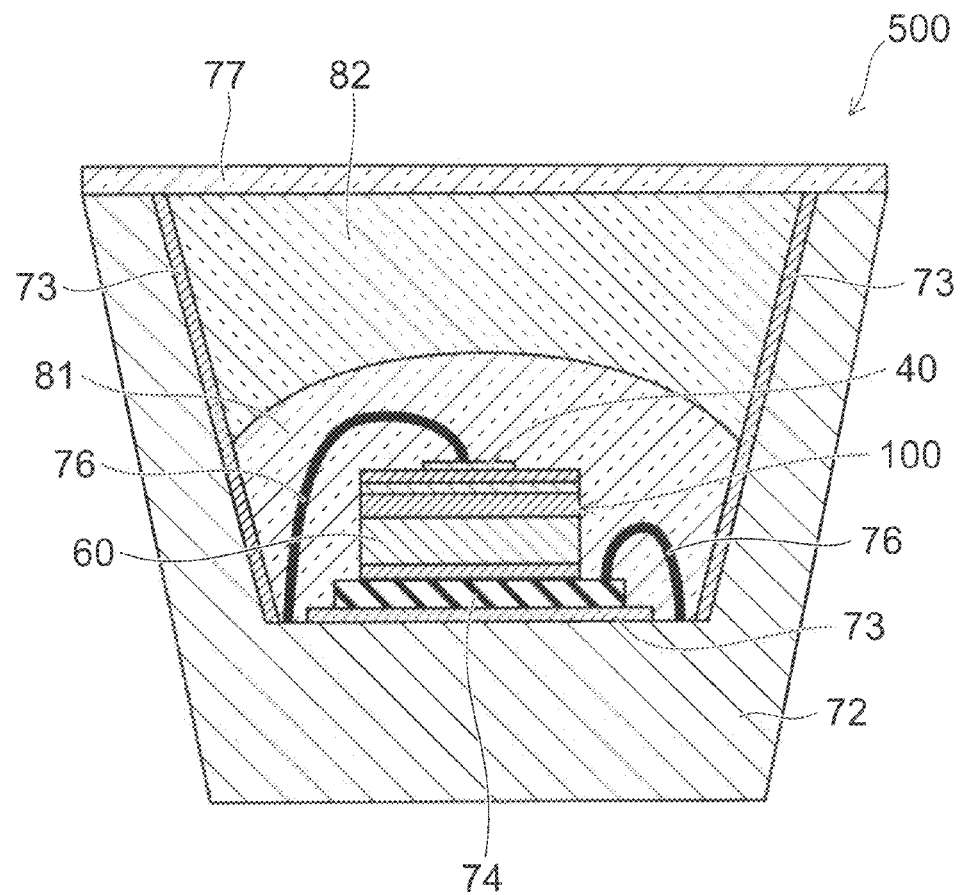
FIG. 13 is a schematic cross-sectional view showing a semiconductor light-emitting apparatus based on the semiconductor light-emitting device.

FIG. 13 is a schematic cross-sectional view illustrating the configuration of a semiconductor light-emitting apparatus based on the semiconductor light-emitting device according to the embodiment of the invention.

In this specific example, the semiconductor light-emitting device 100 according to the first embodiment is used. However, the semiconductor light-emitting apparatus can be based on any of the semiconductor light-emitting devices according to the above embodiments.

The semiconductor light-emitting apparatus 500 is a white LED in which the semiconductor light-emitting device 100 is combined with phosphor. More specifically, the semiconductor light-emitting apparatus 500 according to this embodiment includes the semiconductor light-emitting device 100 and phosphor. The phosphor absorbs light emitted from the semiconductor light-emitting device and emits light having a wavelength different from that of the light.

As shown in FIG. 13, in the semiconductor light-emitting apparatus 500 according to this embodiment, reflective films 73 are provided on the inner surface of a package 72 made of e.g. ceramic. The reflective films 73 are separately provided on the inner side surface and the bottom surface of the package 72. The reflective film 73 is made of e.g. aluminum. On the reflective film 73 provided at the bottom of the package 72, the semiconductor light-emitting device 100 is placed via a submount 74.

The semiconductor light-emitting device 100 is directed so that the side of the major surface 15a provided with the first electrode 40 faces up. For instance, using a low-temperature solder, the rear surface of the conductive substrate 60 is fixed to the submount 74. Alternatively, to fix the semiconductor light-emitting device 100, the submount 74, and the reflective films 73, bonding with adhesive can also be used.

On the surface of the submount 74 on the semiconductor light-emitting device side, an electrode for mounting the conductive substrate 60 of the semiconductor light-emitting device 100 is formed. The electrode is connected through a bonding wire 76 to an electrode, not shown, provided on the package 72 side. On the other hand, the first electrode 40 is also connected through a bonding wire 76 to an electrode, not shown, provided on the package 72 side. These connections are made in a portion between the reflective film 73 on the inner side surface and the reflective film 73 on the bottom surface.

Furthermore, a first phosphor layer 81 containing red phosphor is provided so as to cover the semiconductor light-emitting device 100 and the bonding wires 76. On this first phosphor layer 81 is formed a second phosphor layer 82 containing blue, green, or yellow phosphor. A lid 77 made of silicone resin is provided on this phosphor layer.

The first phosphor layer 81 contains resin and red phosphor dispersed in this resin.

The red phosphor can be based on a matrix made of e.g. $Y_2O_3$, $YVO_4$, or $Y_2(P,V)O_4$, and contains therein trivalent Eu ($Eu^{3+}$) as an activator. That is, $Y_2O_3:Eu^{3+}$, $YVO_4:Eu^{3+}$ and the like can be used as red phosphor. The concentration of $Eu^{3+}$ can be 1% to 10% in terms of molarity.

Besides $Y_2O_3$ and $YVO_4$, the matrix of the red phosphor can be LaOS or $Y_2(P,V)O_4$. Besides $Eu^{3+}$, it is also possible to use $Mn^{4+}$ and the like. In particular, addition of a small amount of Bi in combination with trivalent Eu to the $YVO_4$ matrix increases absorption at 380 nm. This can further increase the light emission efficiency. The resin can be e.g. silicone resin.

The second phosphor layer 82 contains resin and at least one of blue, green, and yellow phosphor dispersed in this resin. For instance, it is possible to use a phosphor combination of blue phosphor and green phosphor, a phosphor combination of blue phosphor and yellow phosphor, and a phosphor combination of blue phosphor, green phosphor, and yellow phosphor.

The blue phosphor can be made of e.g. $(Sr,Ca)_{10}(PO_4)_6Cl_2$:$Eu^{2+}$ or $BaMg_2Al_{16}O_{27}$:$Eu^{2+}$.

The green phosphor can be e.g. $Y_2SiO_5$:$Ce^{3+}$,$Tb^{3+}$ with trivalent Tb acting as an emission center. In this case, energy transfer from the Ce ion to the Tb ion enhances excitation efficiency. Alternatively, the green phosphor can be e.g. $Sr_4Al_{14}O_{25}$:$Eu^{2+}$.

The yellow phosphor can be e.g. $Y_3Al_5$:$Ce^{3+}$.

The resin can be e.g. silicone resin. In particular, trivalent Tb exhibits sharp light emission around 550 nm where the visibility is maximized. Hence, its combination with the red emission of trivalent Eu significantly enhances the light emission efficiency.

In the semiconductor light-emitting apparatus 500 according to this embodiment, the 380-nm ultraviolet light generated from the semiconductor light-emitting device 100 is emitted to the upper and lateral side of the semiconductor light-emitting device 100. In combination with reflection at the reflective film 73, the aforementioned phosphors contained in the phosphor layers can be efficiently excited. For instance, the aforementioned phosphor contained in the first phosphor layer 81, with trivalent Eu and the like acting as an emission center, converts the aforementioned light into light with a narrow wavelength distribution around 620 nm. Thus, red visible light can be efficiently obtained.

Furthermore, the blue, green, and yellow phosphors contained in the second phosphor layer 82 are efficiently excited. Thus, blue, green, and yellow visible light can be efficiently obtained. As a color mixture thereof, white light and light of various other colors can be efficiently obtained with good color rendition.

Thus, in the semiconductor light-emitting apparatus 500, a semiconductor light-emitting apparatus with high efficiency is achieved.

The "nitride semiconductor" referred to herein includes semiconductors having any composition represented by the chemical formula $B_xIn_yAl_zGa_{1-x-y-z}N$ ($0 \le x \le 1$, $0 \le y \le 1$, $0 \le z \le 1$, $x+y+z \le 1$) where the composition ratios x, y, and z are varied in the respective ranges. Furthermore, in the above chemical formula, the "nitride semiconductor" also includes those further containing any group V element other than N (nitrogen), those further containing various elements added for controlling various material properties such as conductivity type, and those further containing various unintended elements.

The embodiments of the invention have been described with reference to examples. However, the invention is not limited to these examples. For instance, the semiconductor layer, electrode, substrate and the like included in the semiconductor light-emitting device can be variously modified by those skilled in the art. Such modifications are also encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible. Such combinations are also encompassed within the scope of the invention as long as they fall within the spirit of the invention.

Furthermore, those skilled in the art can suitably modify and implement the semiconductor light-emitting device described above in the embodiments of the invention. All the semiconductor light-emitting devices thus modified are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor light-emitting device comprising:
a first semiconductor layer of a first conductivity type, the first semiconductor layer having a first major surface provided with a depression, the depression including a bottom face and a side face, the first semiconductor layer having a first surface asperity including a bottom face asperity provided on the bottom face and a side face asperity provided on the side face;
a second semiconductor layer of a second conductivity type provided on an opposite side of the first semiconductor layer from the first major surface;
a light-emitting layer provided between the first semiconductor layer and the second semiconductor layer;
a third semiconductor layer, the first semiconductor layer being disposed between the third semiconductor layer and the light-emitting layer, the third semiconductor layer having an impurity concentration lower than an impurity concentration in the first semiconductor layer, and including an opening continuing the depression; and
a first electrode in contact with the first surface asperity through the opening, the first electrode being reflective to emission light emitted from the light-emitting layer, wherein
a bottom interface between the first electrode and the bottom face has a shape along the bottom face asperity,
a side interface between the first electrode and the side face has a shape along the side face asperity,
a width of the depression along a first direction parallel to the first major surface increases along a second direction from the first semiconductor layer to the third semiconductor layer to cause the side interface and to be inclined with respect to the first major surface.

2. The device according to claim 1, wherein the first surface asperity is provided by etching a surface of the first semiconductor layer.

3. The device according to claim 1, wherein
the first semiconductor layer includes a nitride semiconductor, and
the first surface asperity provided on the first major surface includes a protrusion having a hexagonal planar shape as viewed in a stacking direction from the first semiconductor layer to the second semiconductor layer.

4. The device according to claim 1, wherein the first electrode includes Al or an Al alloy.

5. The device according to claim 4, wherein the first electrode further includes Si.

6. The device according to claim 1, wherein the third semiconductor layer includes a second surface asperity provided on a third major surface of the third semiconductor layer on an opposite side from the first semiconductor layer, the second surface asperity being larger than a peak wavelength of the emission light in the third semiconductor layer.

7. The device according to claim 6, wherein the second surface asperity provided on the third major surface includes a protrusion, and a maximum width of the protrusion along a direction perpendicular to a stacking direction from the first semiconductor layer to the second semiconductor layer is larger than the wavelength in the third semiconductor layer of the peak wavelength of the emission light emitted from the light-emitting layer.

8. The device according to claim 6, wherein the second surface asperity provided on the third major surface is provided by etching a surface of the third semiconductor layer.

9. The device according to claim 6, wherein
the third semiconductor layer includes a nitride semiconductor, and
the second surface asperity provided on the third major surface includes a protrusion having a hexagonal planar shape as viewed in a stacking direction from the first semiconductor layer to the second semiconductor layer.

10. The device according to claim 1, wherein the third semiconductor layer is a non-doped layer.

11. The device according to claim 6, wherein the first surface asperity provided on the first major surface is smaller than the second surface asperity provided on the third major surface.

12. The device according to claim 1, further comprising:
a second electrode provided on a second major surface of the second semiconductor layer on an opposite side from the light-emitting layer,
the second semiconductor layer including a low electrical characteristics portion, and
as viewed along a stacking direction from the first semiconductor layer to the second semiconductor layer, the low electrical characteristics portion being provided in a region including a region where the second semiconductor layer overlaps the first electrode, and the low electrical characteristics portion having at least one of higher contact resistance and lower ohmic characteristics between the second semiconductor layer and the second electrode than a region where the second semiconductor layer does not overlap the first electrode.

13. The device according to claim 1, further comprising:
a second electrode provided on a second major surface of the second semiconductor layer on an opposite side from the light-emitting layer,
the second electrode causing light emitted from the light-emitting layer to be reflected in a direction from the second electrode to the first semiconductor layer.

14. The device according to claim 1, further comprising:
a second electrode provided on a second major surface of the second semiconductor layer on an opposite side from the light-emitting layer and including Ag.

15. The device according to claim 1, further comprising:
a conductive substrate provided on an opposite side of the second semiconductor layer from the light-emitting layer and electrically connected to the second semiconductor layer.

16. The device according to claim 1, further comprising:
a dielectric film provided on a side surface of the first semiconductor layer, the light-emitting layer, and the second semiconductor layer.

17. The device according to claim 1, wherein the first conductivity type is n-type, and the second conductivity type is p-type.

18. The device according to claim 1, wherein the light-emitting layer includes GaInN, and the first semiconductor layer and the third semiconductor layer include GaN.

19. The device according to claim 1, wherein a peak wavelength in air of the emission light emitted from the light-emitting layer is 370 nanometers or more and 400 nanometers or less.

20. The device according to claim 1, wherein the side interface reflects the emission light.

21. The device according to claim 1, wherein
a width of the opening along the first direction increases along the second direction to cause an interface between the first electrode and a side face of the third semiconductor layer in the opening to be inclined with respect to the first major surface.

22. The device according to claim 21, wherein
the third semiconductor layer has an asperity provided on the side face of the third semiconductor layer in the opening, and
the first electrode is in contact with the asperity provided on the side face of the third semiconductor layer in the opening.

\* \* \* \* \*